(12) United States Patent
Yoshikawa et al.

(10) Patent No.: US 12,150,359 B2
(45) Date of Patent: Nov. 19, 2024

(54) DISPLAY DEVICE AND METHOD FOR MANUFACTURING DISPLAY DEVICE

(71) Applicant: SHARP KABUSHIKI KAISHA, Sakai (JP)

(72) Inventors: Hirofumi Yoshikawa, Sakai (JP); Tatsuya Ryohwa, Sakai (JP); Masumi Kubo, Sakai (JP); Takahiro Doe, Sakai (JP); Masaki Yamamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 477 days.

(21) Appl. No.: 17/641,761

(22) PCT Filed: Oct. 2, 2019

(86) PCT No.: PCT/JP2019/038963
§ 371 (c)(1),
(2) Date: Mar. 9, 2022

(87) PCT Pub. No.: WO2021/064909
PCT Pub. Date: Apr. 8, 2021

(65) Prior Publication Data
US 2022/0320191 A1    Oct. 6, 2022

(51) Int. Cl.
*H10K 59/35*    (2023.01)
*H10K 50/115*    (2023.01)
*H10K 59/12*    (2023.01)
*H10K 59/38*    (2023.01)
*H10K 71/00*    (2023.01)
(Continued)

(52) U.S. Cl.
CPC .......... *H10K 59/35* (2023.02); *H10K 50/115* (2023.02); *H10K 71/00* (2023.02); *H10K 59/12* (2023.02); *H10K 59/38* (2023.02); *H10K 2102/101* (2023.02); *H10K 2102/331* (2023.02)

(58) Field of Classification Search
CPC ...... H10K 59/35; H10K 50/115; H10K 71/00; H10K 59/12; H10K 59/38; H10K 2102/101; H10K 2102/331; C09K 11/025; C09K 11/883; G02B 5/201; H05B 33/20; H01L 25/167; H01L 33/06
See application file for complete search history.

(56) References Cited

U.S. PATENT DOCUMENTS 5,537,000 A * 7/1996 Alivisatos .............. B82Y 30/00
                                                        313/499
6,121,075 A * 9/2000 Yamashita .......... H01L 29/7613
                                                        438/149
(Continued)

FOREIGN PATENT DOCUMENTS

JP    2012234748 A    11/2012
JP    2019073705 A    5/2019
(Continued)

*Primary Examiner* — Caleb E Henry
(74) *Attorney, Agent, or Firm* — ScienBiziP, P.C.

(57) ABSTRACT

A display device includes a plurality of pixel electrodes, a common electrode common to the plurality of pixel electrodes, and a light-emitting layer sandwiched between the plurality of pixel electrodes and the common electrode. The light-emitting layer includes quantum dots covered by ferritin. Each of the plurality of pixel electrodes and the quantum dots are bonded via a peptide modifying the ferritin.

20 Claims, 17 Drawing Sheets

(51) Int. Cl.
*H10K 102/00* (2023.01)
*H10K 102/10* (2023.01)

(56) References Cited

U.S. PATENT DOCUMENTS

| | | | | |
|---|---|---|---|---|
| 7,651,674 | B2* | 1/2010 | Jun | C09K 11/565 |
| | | | | 977/773 |
| 8,390,913 | B2* | 3/2013 | Naitou | G11B 7/00455 |
| | | | | 359/321 |
| 9,812,004 | B1* | 11/2017 | Boshernitzan | G08C 17/02 |
| 9,831,706 | B2* | 11/2017 | MacWilliams | H02J 7/32 |
| 9,874,693 | B2* | 1/2018 | Baiocco | H01L 21/762 |
| 9,902,903 | B2* | 2/2018 | Fuchter | H10K 85/657 |
| 10,600,980 | B1* | 3/2020 | Boardman | H10K 59/877 |
| 10,749,130 | B2* | 8/2020 | Kim | H10K 50/805 |
| 11,367,859 | B2* | 6/2022 | Hamilton | H10K 71/441 |
| 2004/0110347 | A1 | 6/2004 | Yamashita | |
| 2004/0197884 | A1 | 10/2004 | Okuda et al. | |
| 2006/0039850 | A1* | 2/2006 | Jun | C09K 11/08 |
| | | | | 423/561.1 |
| 2008/0153713 | A1* | 6/2008 | Matsui | C40B 40/10 |
| | | | | 506/32 |
| 2010/0053928 | A1* | 3/2010 | Belcher | C07K 17/14 |
| | | | | 977/773 |
| 2010/0140586 | A1* | 6/2010 | Char | C09K 11/883 |
| | | | | 257/14 |
| 2012/0280345 | A1* | 11/2012 | Zhu | G02B 6/1226 |
| | | | | 257/E31.127 |
| 2013/0037778 | A1* | 2/2013 | Kazlas | C09K 11/883 |
| | | | | 257/E29.024 |
| 2014/0027816 | A1* | 1/2014 | Cea | H01L 29/1054 |
| | | | | 257/E29.085 |
| 2014/0116502 | A1* | 5/2014 | Samukawa | H01L 31/035218 |
| | | | | 257/14 |
| 2014/0150855 | A1* | 6/2014 | Inoue | B82Y 40/00 |
| | | | | 136/254 |
| 2014/0197507 | A1* | 7/2014 | Assefa | H01L 31/0745 |
| | | | | 438/69 |
| 2015/0091093 | A1* | 4/2015 | Bouche | H01L 29/45 |
| | | | | 257/369 |
| 2015/0268417 | A1* | 9/2015 | Assefa | H01L 27/1461 |
| | | | | 385/14 |
| 2016/0027848 | A1* | 1/2016 | Liu | H10K 59/38 |
| | | | | 257/40 |
| 2016/0276507 | A1* | 9/2016 | Kanakura | H01L 31/035218 |
| 2017/0233645 | A1* | 8/2017 | Zhong | C09K 11/06 |
| | | | | 252/301.16 |
| 2018/0211979 | A1 | 7/2018 | Lee et al. | |
| 2018/0254421 | A1* | 9/2018 | Kinge | H10K 30/35 |
| 2018/0309078 | A1* | 10/2018 | Ju | H10K 71/421 |
| 2018/0351125 | A1* | 12/2018 | He | H10K 50/16 |
| 2019/0074462 | A1* | 3/2019 | Park | H10K 85/20 |
| 2019/0115507 | A1 | 4/2019 | Kim et al. | |
| 2019/0288230 | A1* | 9/2019 | Kim | H10K 50/15 |
| 2020/0226452 | A1* | 7/2020 | Rourk | G06N 3/063 |
| 2021/0217996 | A1* | 7/2021 | Hamilton | H10K 71/15 |
| 2022/0320191 | A1* | 10/2022 | Yoshikawa | G02B 5/201 |
| 2022/0344606 | A1* | 10/2022 | Yoshikawa | H10K 50/115 |
| 2023/0105598 | A1* | 4/2023 | Kim | H10K 59/38 |
| | | | | 257/40 |
| 2023/0136993 | A1* | 5/2023 | Yoshikawa | H10K 50/115 |
| | | | | 257/40 |
| 2023/0139500 | A1* | 5/2023 | Kim | C09K 11/883 |
| | | | | 362/84 |
| 2023/0192975 | A1* | 6/2023 | Wang | C08K 3/30 |
| | | | | 428/220 |

FOREIGN PATENT DOCUMENTS

| | | |
|---|---|---|
| WO | 03/099708 A1 | 12/2003 |
| WO | 2004/033366 A1 | 4/2004 |

* cited by examiner (a)

(b)

(c)

(d)

DISPLAY DEVICE AND METHOD FOR MANUFACTURING DISPLAY DEVICE

TECHNICAL FIELD

The disclosure relates to a display device and a manufacturing method of the display device.

BACKGROUND ART

There are several known techniques for coloring a plurality of light-emitting layers differently, when manufacturing a quantum dot light emitting diode (QLED) display device. Among these, a technique known as a solution coating method has been attracting attention, due to its advantage in terms of productivity and the like. An inkjet method is a typical example of such a technique.

According to a known solution coating method, coating of a quantum dot material is performed after a partition is formed. Generally, with the solution coating method of the known technique, two adjacent light-emitting layers are distinguished from each other using this partition (see, PTL 1).

CITATION LIST

Patent Literature

PTL 1: JP 2012-234748A (published on Nov. 29, 2012)

SUMMARY

Technical Problem

A larger total area of the partition formed, or even the formation of the partition itself leads to a smaller area of the light-emitting layer formed. This leads to a lower aperture ratio of the display device, resulting in a problem in that the brightness of the display device is low.

An object of one aspect of the disclosure is to provide a display device featuring a high brightness and a manufacturing method of the display device.

Solution to Problem

A display device according to one aspect of the disclosure includes: a plurality of pixel electrodes; a common electrode common to the plurality of pixel electrodes; and a light-emitting layer sandwiched between the plurality of pixel electrodes and the common electrode, in which the light-emitting layer includes quantum dots covered by ferritin, and each of the plurality of pixel electrodes and the quantum dots are bonded via a peptide modifying the ferritin.

A display device according to one aspect of the disclosure includes: a plurality of pixel electrodes; a common electrode common to the plurality of pixel electrodes; and a carrier transport layer and a light-emitting layer sandwiched between the plurality of pixel electrodes and the common electrode, in which the light-emitting layer includes quantum dots covered by ferritin, and the carrier transport layer and the quantum dots are bonded via a peptide modifying the ferritin.

A manufacturing method of a display device according to one aspect of the disclosure includes: creating a first pixel electrode; and creating a first light-emitting layer configured to emit light of a first color by applying a first quantum dot covered by ferritin on the first pixel electrode, in which the first pixel electrode and the first quantum dot are bonded via a peptide modifying the ferritin.

A manufacturing method of a display device according to one aspect of the disclosure includes: creating a first pixel electrode; creating a first carrier transport layer on the first pixel electrode; and creating a first light-emitting layer configured to emit light of a first color by applying a first quantum dot covered by ferritin on the first carrier transport layer, in which the first carrier transport layer and the first quantum dot are bonded via a peptide modifying the ferritin.

Advantageous Effects of Disclosure

According to an aspect of the disclosure, a display device featuring a high brightness and a manufacturing method of the display device can be realized.

DESCRIPTION OF EMBODIMENTS

Figure 1:
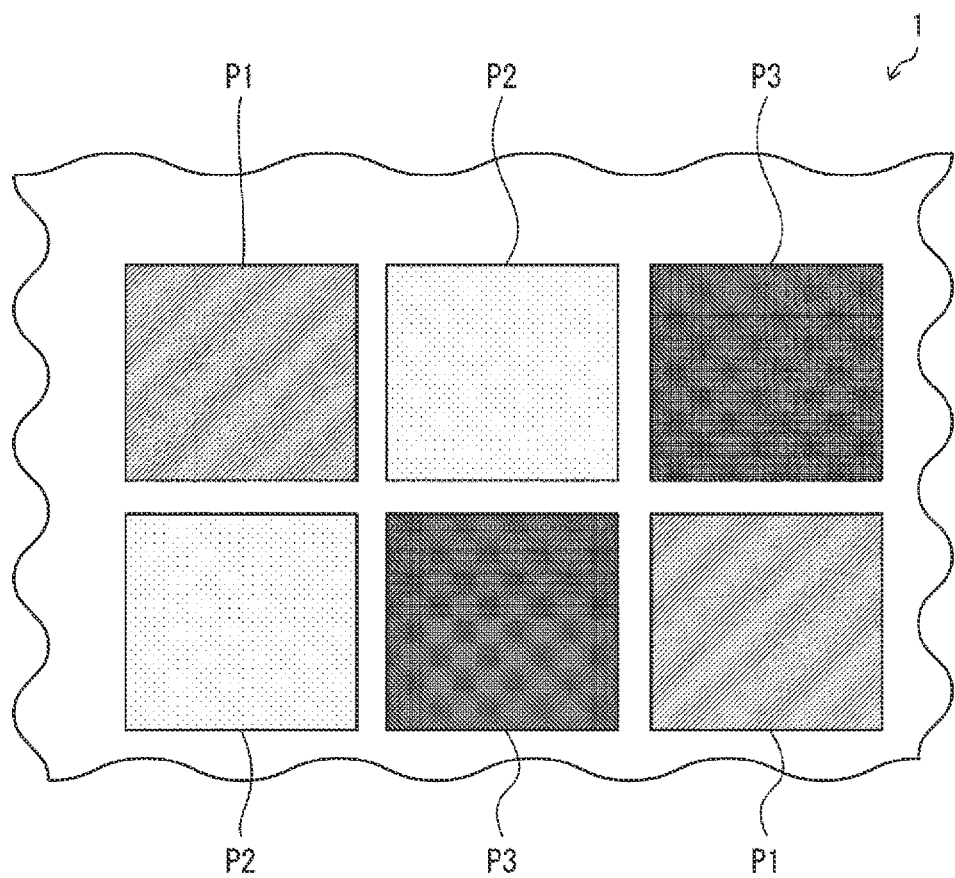
FIG. 1 is a plan view illustrating a schematic configuration of a main portion of a display device according to a first embodiment of the disclosure.

Embodiments of the disclosure will be described below. Note that, for convenience of description, members having the same functions as those of the members described earlier may be denoted by the same reference numerals and signs, and the description thereof will not be repeated.

First Embodiment

FIG. 1 is a plan view illustrating a schematic configuration of main portions of a display device 1 according to a first embodiment of the disclosure. As illustrated in FIG. 1, the display device 1 includes pixels P1 (first pixels), pixels P2 (second pixels), and pixels P3 (third pixels). In the display device 1, a plurality of pixels, including the pixels P1, the pixels P2, and the pixels P3, are arranged in a matrix form for example. The pixels P1 emit blue (first color) light. The pixels P2 emit green (second color) light. The pixels P3 emit red (third color) light. Of course, the blue light emitted from the pixels P1, the green light emitted from the pixels P2, and the red light emitted from the pixels P3 differ from each other in wavelength. Specifically, the wavelength of the green light emitted from the pixels P2 is longer than the wavelength of the blue light emitted from the pixels P1, and the wavelength of the red light emitted from the pixels P3 is longer than the wavelength of the green light emitted from the pixels P2.

Figure 2:
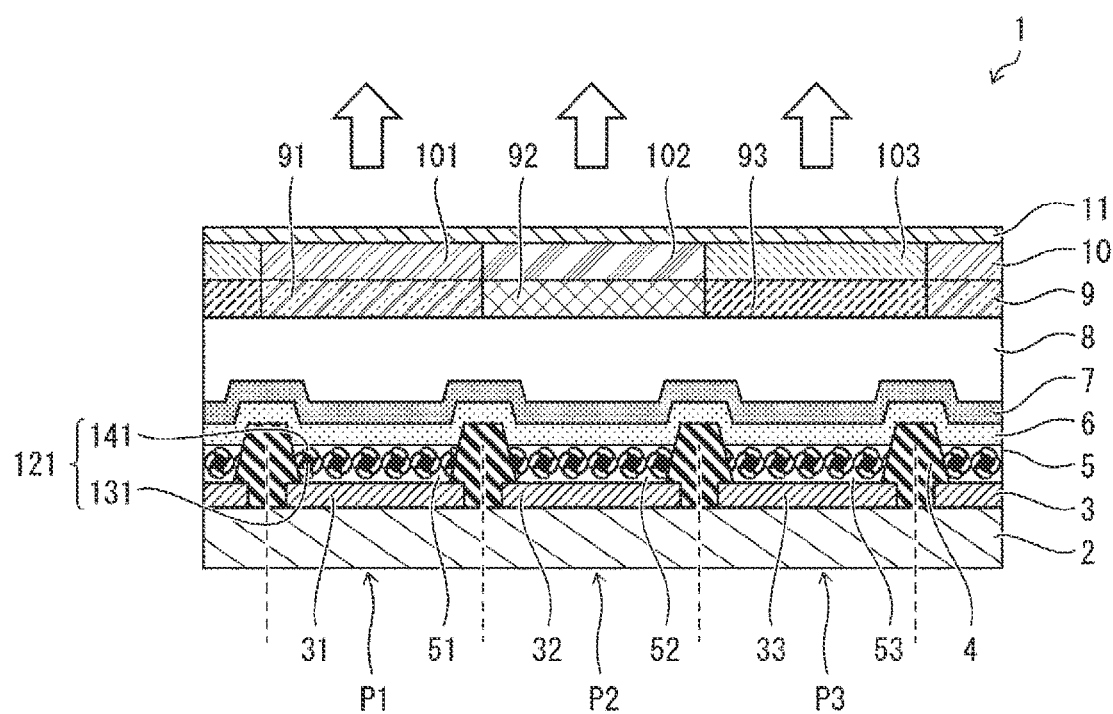
FIG. 2 is a cross-sectional view illustrating a cross section of the display device according to the first embodiment of the disclosure.

FIG. 2 is a cross-sectional view illustrating a cross section of the display device 1 according to the first embodiment of the disclosure. As illustrated in FIG. 2, the display device 1 includes a substrate 2, pixel electrodes 3, edge covers 4, light-emitting layers 5, a carrier transport layer 6, a common electrode 7, a sealing layer 8, quantum dot layers 9, color filters 10, and a functional film 11.

The substrate 2 is a so-called array substrate having a thin film transistor (TFT) (not illustrated) formed thereon. The pixel electrodes 3 are electrically connected to the TFT.

The pixel electrodes 3 are provided on the substrate 2. The pixel electrodes 3 are island-shaped electrodes formed individually for the respective pixels, and are used for applying a predetermined display voltage to the light-emitting layers 5 and the carrier transport layer 6. In FIG. 2, the pixel electrodes 3 include a pixel electrode 31 (first pixel electrode), a pixel electrode 32 (second pixel electrode), and a pixel electrode 33 (third pixel electrode). The pixel electrode 31 is provided to the pixel P1, the pixel electrode 32 is provided to the pixel P2, and the pixel electrode 33 is provided to the pixel P3. The pixel electrodes 3 are each formed of a desired metal material.

The edge covers 4 are respectively provided around the pixel electrode 31, around the pixel electrode 32, and around the pixel electrode 33. The edge covers 4 are respectively disposed between two adjacent ones of the pixel electrode 31, the pixel electrode 32, and the pixel electrode 33. For example, for the pixel P1 and the pixel P2 adjacent to each other (see FIG. 2), the edge cover 4 is disposed between the pixel electrode 31 and the pixel electrode 32, and is formed around the pixel electrode 31. The edge cover 4 can be formed of a well-known material, and can be formed, for example, of polyimide.

The light-emitting layers 5 are layers that are respectively provided on the pixel electrodes 3, and each of the light-emitting layers 5 includes a light-emitting element emitting light of a specific color. In the present embodiment, the light-emitting element is a quantum dot. The light-emitting layers 5 include a light-emitting layer 51 (first light-emitting layer), a light-emitting layer 52 (second light-emitting layer), and a light-emitting layer 53 (third light-emitting layer) that are each provided to be in an island shape. The light-emitting layer 51 is provided to the pixel P1, the light-emitting layer 52 is provided to the pixel P2, and the light-emitting layer 53 is provided to the pixel P3. In the present embodiment, the light-emitting layer 51, the light-emitting layer 52, and the light-emitting layer 53 all have the same configuration. In other words, the light-emitting layers 5 are configured to emit light of the same color regardless of the type of pixels provided with the light-emitting layers 5. A light-emitting region in the display device 1 is defined by the overlapping region between the pixel electrodes 3, the light-emitting layers 5, and the common electrode 7, exposed through openings of the edge covers 4. In the light-emitting region, current flows from the pixel electrodes 3 (anodes) to the common electrode 7, resulting in light emission from the light-emitting region.

The carrier transport layer 6 is provided on the light-emitting layers 5. A known electron transport layer and a known hole transport layer are collectively referred to as the carrier transport layer 6. The carrier transport layer 6 can be formed of a well-known material (an inorganic material or an organic material for example).

The common electrode 7 is a transparent electrode provided on the carrier transport layer 6. In FIG. 2, the common electrode 7 is commonly provided to the plurality of pixel electrodes including the pixel electrode 31, the pixel electrode 32, and the pixel electrode 33. The common electrode 7 may be composed of a transparent conductive material such as a MgAg alloy (extra-thin film), an indium tin oxide (ITO), or an indium zinc oxide (IZO). FIG. 2 illustrates an example in which the common electrode 7 is a cathode and the pixel electrodes 3 are anodes. In this case, the carrier transport layer 6 serves as an electron transport layer. On the other hand, the common electrode 7 may be an anode, and the pixel electrodes 3 may be cathodes. In this case, the carrier transport layer 6 serves as a hole transport layer.

The sealing layer 8 is a layer that is provided on the common electrode 7 to seal various layers provided to the substrate 2, for protecting the interior of the display device 1 from the external environment.

The quantum dot layers 9 are layers provided on the sealing layer 8 and including quantum dots that emit light of a predetermined color. In the present embodiment, the quantum dot layers 9 include a quantum dot layer 91, a quantum dot layer 92, and a quantum dot layer 93. The quantum dot layer 91 (first color conversion layer) includes quantum dots that emit blue light. The quantum dot layer 92 (second color conversion layer) includes quantum dots that emit green light. The quantum dot layer 93 (third color conversion layer) includes quantum dots that emit red light. The quantum dot layer 91 is provided to the pixel P1, the quantum dot layer 92 is provided to the pixel P2, and the quantum dot layer 93 is provided to the pixel P3.

Each of the color filters 10 is a filter that is provided on a corresponding one of the quantum dot layers 9 and through which light of a predetermined color can pass. In the present embodiment, the color filters 10 include a color filter 101 through which blue light can pass, a color filter 102 through which green light can pass, and a color filter 103 through which red light can pass. The color filter 101 is provided to the pixel P1, the color filter 102 is provided to the pixel P2, and the color filter 103 is provided to the pixel P3. With the display device 1 including the color filters 10, the color purity of the display device 1 can be improved. Note that, depending on the application of the display device 1, the display device 1 need not to be provided with the color filters 10.

The functional film 11 is a film provided on the color filters 10 and having various functions such as, for example, touch detection.

As illustrated in FIG. 2, the light-emitting layers 5 include a plurality of quantum dot units 121. The quantum dot units 121 each include a quantum dot 131 (first quantum dot) and ferritin 141 with which the quantum dot 131 is covered. The quantum dot 131 is a light-emitting element that is excited when a carrier is injected into the quantum dot 131, to emit light of a predetermined color based on the composition of the quantum dot 131. In FIG. 2, the quantum dot 131 is a quantum dot that emits near-ultraviolet light. The light-emitting layer 51, the light-emitting layer 52, and the light-emitting layer 53 all include the quantum dot units 121 with the same structure, and thus emit the same near-ultraviolet light.

Quantum Dot Unit 121

Figure 3:
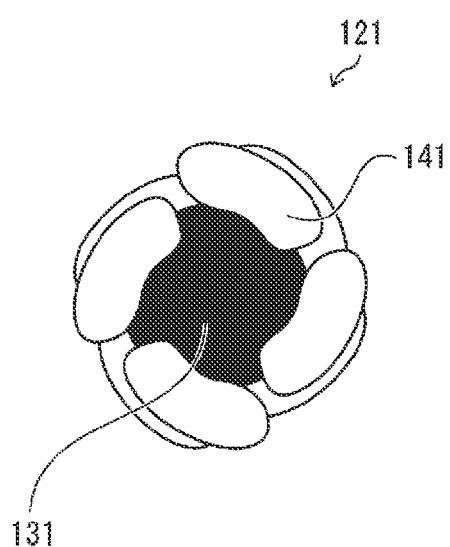
FIG. 3 is a schematic view of a quantum dot unit.

FIG. 3 is a schematic view of the quantum dot unit 121. The quantum dot 131 included in the quantum dot unit 121 can also be referred to as QD or a QD phosphor particle or the like. The ferritin 141 can also be referred to as ferritin protein.

The ferritin 141 is a type of iron-binding protein. In the cells of an organism, the ferritin 141 has a generally spherical shell shape and has a cage-like shape such that bound iron is incorporated inside the spherical shell. The ferritin 141 has a function of storing iron in its cage and releasing iron in the cage when needed. In the quantum dot unit 121, the ferritin 141 contains the quantum dot 131 instead of iron.

Specific examples of the ferritin 141 include recombinant horse-derived ferritin. Further examples include ferritin derived from humans, rats, and the like. The ferritin 141 has a substantially common basic structure, with an outer diameter of 12 nm and an inner diameter of 7 nm. Note that listeria-bacteria-derived Dps protein is one type of protein classified as the ferritin 141, and has a small size with an outer diameter of 9 nm and an inner diameter of 4.5 nm.

The diameter of the ferritin 141 is a value obtained by subtracting the inner diameter dimension from the outer diameter dimension, and thus is approximately 5 nm. Since the ferritin 141 only has a diameter of about 5 nm, electron injection to the quantum dot 131 contained in the ferritin 141 is implemented by the tunnel effect.

The quantum dot 131 may include CdSe in its composition. The ferritin 141 that covers the quantum dot 131 can be formed by using what is known as Slow Chemical Reaction. Specifically, a tetraammine complex is formed by coordinating ammonia with Cd ions. Then, by adding selenourea to this tetraammine complex, Se ions are supplied to the tetraammine complex.

Figure 4:
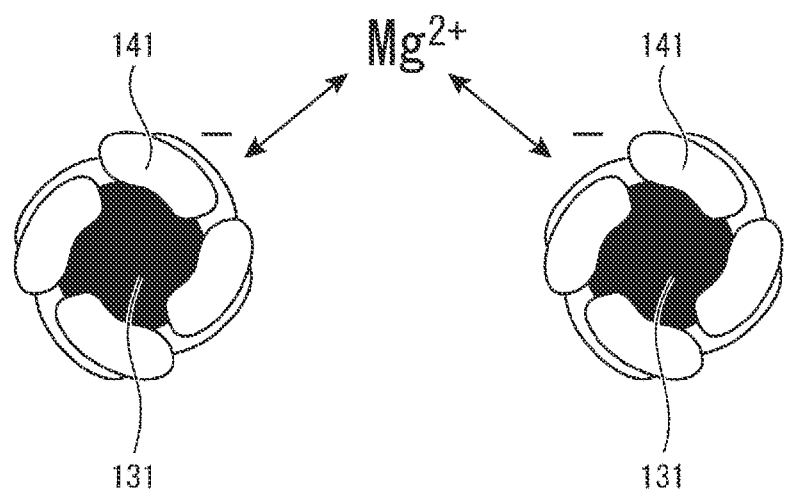
FIG. 4 is a diagram illustrating the relationship between ferritin containing a quantum dot and cationic metal.

FIG. 4 is a diagram illustrating the relationship between the ferritin 141 containing the quantum dot 131 and cationic metal. There is a moiety referred to as a metal binding site outside a plurality of ferritins 141. When divalent cationic metal ions (for example, magnesium ions) are bonded to this metal binding site, a salt bridge is formed between two ferritins 141, and these ferritins 141 can be strongly linked.

Figure 5:
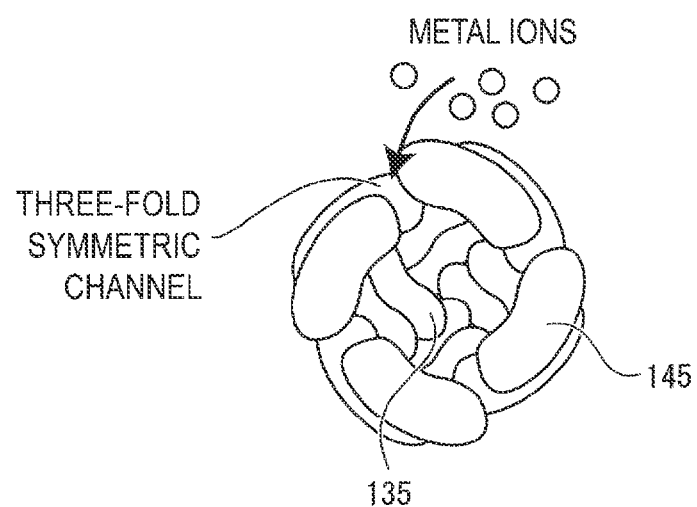
FIG. 5 is a diagram illustrating apoferritin that does not contain any quantum dot.

FIG. 5 is a diagram illustrating apoferritin 145 that does not contain the quantum dot 131. The ferritin 141 is a spherical protein having a spherical-shell-shaped structure in which 24 subunits are self-assembled. The ferritin 141 is one of the iron storage proteins present in many organisms from bacteria to plants and animals. The ferritin 141 exists in mammals such as horses and rats, as well as humans, and in soybean, corn, cyanobacteria, and the bacterium *Helicobacter pylori*, which has become famous as a cause of gastric cancer in recent years. The basic structures and functions of the ferritin are almost the same, and a cavity 135 having a diameter of several nanometers is formed inside. Ferritin derived from the spleen of a mammal horse is a spherical-shell-shaped protein that is a tetracosamer consisting of two types of monomer subunits having light chains with a molecular weight of approximately 19000 and heavy chains with a molecular weight of approximately 20000 and that has a total molecular weight of approximately 480000.

The ferritin 141 has a diameter of approximately 12 nm and is provided at its center with the cavity 135 having a diameter of 7 nm. This cavity 135 can store approximately 4500 iron elements per ferritin molecule in the form of ferrihydrite ($5Fe_2O_3 \cdot 9H_2O$) crystals. In addition, when there is a deficiency of iron in a living body, this iron is reduced and discharged so as to maintain the balance of the iron ion concentration in the living body.

The ferritin 141 is optimal as a biotemplate because it retains both self-assembly and biomineralization capabilities. The ferritin 141 refers to one having a core (nanoparticles) inside the cavity 135, whereas the apoferritin 145 refers to one having a vacancy. Various types of nanoparticles can be made inside the apoferritin 145.

As illustrated in FIG. 2, the pixel P1 includes the pixel electrode 31, the light-emitting layer 51, the carrier transport layer 6, the common electrode 7, the quantum dot layer 91, and the color filter 101. The pixel P2 includes the pixel electrode 32, the light-emitting layer 52, the carrier transport layer 6, the common electrode 7, the quantum dot layer 92, and the color filter 102. The pixel P3 includes the pixel electrode 33, the light-emitting layer 53, the carrier transport layer 6, the common electrode 7, the quantum dot layer 93, and the color filter 103. In the pixel P1, the light-emitting layer 51 is sandwiched between the pixel electrode 31 and the common electrode 7. In the pixel P2, the light-emitting layer 52 is sandwiched between the pixel electrode 32 and the common electrode 7. In the pixel P3, the light-emitting layer 53 is sandwiched between the pixel electrode 33 and the common electrode 7.

The pixel electrodes 3 are the same material for the pixel P1, the pixel P2, and the pixel P3. Thus, the material of the pixel electrode 31, the material of the pixel electrode 32, and the material of the pixel electrode 33 are the same. The material of the pixel electrodes 3 is metal. As an example, the pixel electrodes 3 are assumed to include metal A. The ferritin 141 has been modified with a peptide for recognizing this metal A. When the pixel electrode 31 includes the metal A, the pixel electrode 32 and the pixel electrode 33 also include the metal A. The metal A is selected depending on the type of metal to be recognized by the peptide to be bonded, and examples thereof include gold, platinum, palladium, titanium, silver, and nickel. The pixel electrodes 3 may include at least one metal among these selection examples.

Note that "recognizing (a certain metal)" refers to "selectively adhering to or being attracted to (a certain metal)". In the pixel P1, the pixel electrode 31 and the quantum dots 131 are bonded via the peptide modifying the ferritin 141. Examples of the bonding include ionic bonding. As a result, with electrostatic interaction between the pixel electrode 31 and the peptide, the quantum dots 131 can be selectively disposed on the pixel electrode 31. Thus, no partition needs to be formed around the pixel electrode 31 for coloring the quantum dots 131 separately. With the partition thus omitted, the display device 1 featuring a high aperture ratio and a high brightness can be obtained. Also for the pixel electrodes 32 and 33, the quantum dots 131 are selectively disposed on the pixel electrode 32 and the pixel electrode 33 using the quantum dot units 121, meaning that no partition needs to be formed also around the pixel electrode 32 or 33.

In the display device 1 of the configuration illustrated in FIG. 2 (first configuration), a difference in color of emitted light among the pixel P1, the pixel P2, and the pixel P3 is achieved using the quantum dot layers 9 and the color filters 10. The pixel P1 includes the quantum dot layer 91 as an upper layer above the common electrode 7. The quantum dot layer 91 is a light conversion layer that emits blue light through photoexcitation using near-ultraviolet light emitted from the light-emitting layer 51. The pixel P2 includes the quantum dot layer 92 as an upper layer above the common electrode 7. The quantum dot layer 92 is a light conversion layer that emits green light through photoexcitation using near-ultraviolet light emitted from the light-emitting layer 52. The pixel P3 includes the quantum dot layer 93 as an upper layer above the common electrode 7. The quantum dot layer 93 is a light conversion layer that emits red light through photoexcitation using near-ultraviolet light emitted from the light-emitting layer 53.

In the pixel P1, the quantum dots in the quantum dot layer 91 are photoexcited by near-ultraviolet light emitted from the light-emitting layer 51. As a result, blue light is emitted. This blue light passes through the blue color filter 101 disposed on the quantum dot layer 91 and is emitted to the outside of the display device 1. Thus, the pixel P1 emits blue light. In the pixel P2, the quantum dots in the quantum dot layer 92 are photoexcited by near-ultraviolet light emitted from the light-emitting layer 52. As a result, green light is emitted. This green light passes through the green color filter 102 disposed on the quantum dot layer 92 and is emitted to the outside of the display device 1. Thus, the pixel P2 emits green light. In the pixel P3, the quantum dots in the quantum dot layer 93 are photoexcited by near-ultraviolet light emitted from the light-emitting layer 53. As a result, red light is emitted. This red light passes through the red color filter 103 disposed on the quantum dot layer 93 and is emitted to the outside of the display device 1. Thus, the pixel P3 emits red light.

The display device 1 may have a configuration (second configuration) not including the color filters 10. In the second configuration, the blue light, the green light, and the red light obtained as a result of color conversion of the near-ultraviolet light by the quantum dot layer 91, the quantum dot layer 92, and the quantum dot layer 93, respectively, are emitted to the outside of the display device 1 without passing through the color filters 10. Thus, a difference in color of emitted light among the pixel P1, the pixel P2, and the pixel P3 can be achieved.

The display device 1 may have a configuration (third configuration) in which the quantum dots 131 included in the light-emitting layer 5 emit blue light through carrier injection. The display device 1 having the third configuration includes the quantum dot layer 92, the quantum dot layer 93, the color filter 102, and the color filter 103. The pixel P1 that displays blue may or may not include the quantum dot layer 91 and the color filter 101. It suffices that the quantum dot layer 92 includes quantum dots that emit green light through photoexcitation using blue light, and the quantum dot layer 93 includes quantum dots that emit red light through photoexcitation using blue light.

According to the third configuration, in the pixel P1, the blue light emitted from the light-emitting layer 51 is emitted to the outside of the display device 1 without the color conversion. Thus, the pixel P1 emits blue light. Specifically, the color of the light emitted from the light-emitting layer 51 and the color of the light emitted from the pixel P1 are both blue. On the other hand, in the pixel P2, the quantum dots in the quantum dot layer 92 are photoexcited by the blue light emitted from the light-emitting layer 52. As a result, green light is emitted. This green light passes through the color filter 102 disposed on the quantum dot layer 92 and is emitted to the outside of the display device 1. Thus, the pixel P2 emits green light. In the pixel P3, the quantum dots in the quantum dot layer 93 are photoexcited by the blue light emitted from the light-emitting layer 53. As a result, red light is emitted. This red light passes through the color filter 103 disposed on the quantum dot layer 93 and is emitted to the outside of the display device 1. Thus, the pixel P3 emits red light.

As described above, also with the third configuration, a difference in color of emitted light among the pixel P1, the pixel P2, and the pixel P3 can be achieved.

The display device 1 may have another configuration (fourth configuration) in which the quantum dots 131 included in the light-emitting layer 5 emit blue light through carrier injection. The display device 1 having the fourth configuration may only include the quantum dot layer 92 and the quantum dot layer 93. In other words, the pixel P1 that displays blue does not include the quantum dot layer 91 or the color filter 101, the pixel P2 for displaying green does not include the color filter 102, and the pixel P3 for displaying red does not include the color filter 103. It suffices that the quantum dot layer 92 includes quantum dots that emit green light through photoexcitation using blue light, and the quantum dot layer 93 includes quantum dots that emit red light through photoexcitation using blue light. Thus, the display device 1 having the fourth configuration is obtained by removing the color filters 102 and 103 from the display device having the third configuration.

In the fourth configuration, the blue light emitted from the light-emitting layer 51, the green light as a result of color conversion from blue by the quantum dot layer 92, and the red light as a result of color conversion from blue by the quantum dot layer 93 are emitted to the outside of the display device 1 without passing through the color filters 10. Thus, a difference in color of emitted light among the pixel P1, the pixel P2, and the pixel P3 can be achieved.

Figure 6:
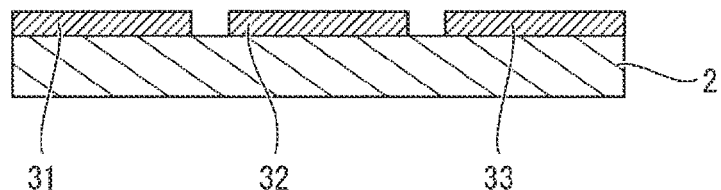
FIGS. 6(a) to (d) are diagrams illustrating a manufacturing method of the display device according to the first embodiment of the disclosure.
Figure 6:
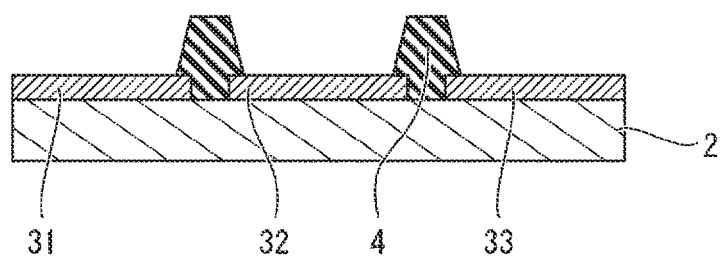
Figure 6:
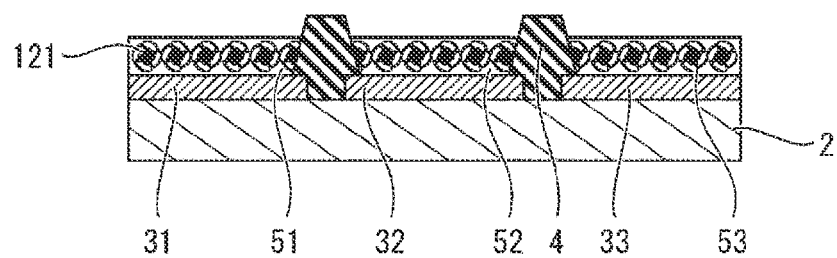
Figure 6:
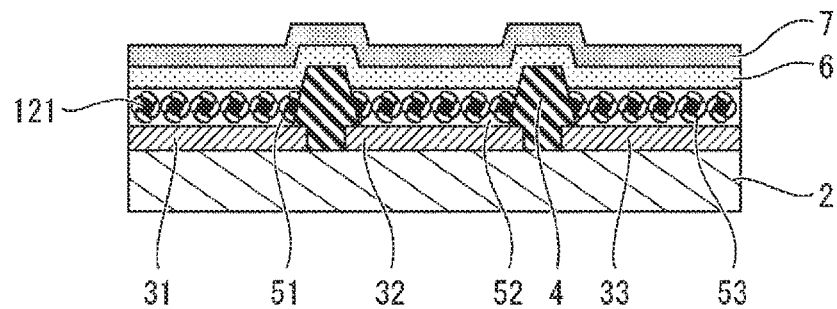

FIGS. 6(*a*) to (*d*) are diagrams illustrating a manufacturing method of the display device 1 according to the first embodiment of the disclosure. First of all, as illustrated in FIG. 6(*a*), the plurality of pixel electrodes 31, 32, and 33 are created on the substrate 2. In this process, for example, the pixel electrodes 31 to 33 are simultaneously created on the substrate 2 by sputtering or the like using titanium as the material. Next, as illustrated in FIG. 6(*b*), the edge covers 4 are created between the pixel electrodes 3. In this process, for example, the material (polyimide resin for example) of the edge covers 4 is applied on the substrate 2 to have a thickness from about 1 to 1.5 μm. Then, a photolithography process is performed, leaving polyimide to serve as the edge cover 4 portion on the substrate 2, whereby a plurality of edge covers 4 are created on the substrate 2.

Next, as illustrated in FIG. 6(*c*), a solution including the quantum dot units 121 is applied on the pixel electrodes 31 to 33. After being left for a while, the excess solution is removed by centrifugal separation or the like. As a result, the light-emitting layer 51 is created on the pixel electrode 31, the light-emitting layer 52 is created on the pixel electrode 32, and the light-emitting layer 53 is created on the pixel electrode 33. In this process, the ferritin 141 included in the quantum dot unit 121 is bonded to the metal material of the pixel electrodes 31 to 33, but not to the material of the edge covers 4. Thus, when the solution is removed, the quantum dot units 121 remain on the pixel electrodes 31 to 33 in the bonded state. As a result, the light-emitting layers 51 to 53 can be selectively created on the pixel electrodes 31 to 33, respectively. In this manner, with the edge covers 4 created after the pixel electrodes 31 to 33 are created, the light-emitting layers 51 to 53 can be created at once, whereby the pixels P1 to P3 can be efficiently created.

Next, as illustrated in FIG. 6(d), the carrier transport layer 6 and the common electrode 7 are each created. The carrier transport layer 6 can be created over the light-emitting layer 51, the light-emitting layer 52, and the light-emitting layer 53, by applying the material of the carrier transport layer 6 on the substrate 2 and then sintering. Alternatively, the carrier transport layer 6 can be created by applying the nanoparticle material of the carrier transport layer 6 on the substrate 2. The sintering is performed with the material of the carrier transport layer 6 sintered under an environment with a temperature (not higher than 80° C.) low enough to prevent the ferritin 141 from burning. Thus, the carrier transport layer 6 can be created without destroying the light-emitting layers 5. In the present embodiment, the carrier transport layer 6 is created by using an inorganic material.

Since the ferritin 141 included in the quantum dot units 121 can also serve as the carrier transport layer 6, the carrier transport layer 6 need not be created. The common electrode 7 is created on the carrier transport layer 6 by sputtering or is created by applying the material of the common electrode 7 on the carrier transport layer 6 and then sintering. The sintering is performed with the material of the common electrode 7 sintered under an environment with a temperature (not higher than 80° C.) low enough to prevent the ferritin 141 from burning. Thus, the common electrode 7 can be created without destroying the light-emitting layers 5.

Thereafter, the sealing layer 8, the quantum dot layers 9, the color filters 10, and the functional film 11 are created. Any known technique can be employed for creating these. First of all, the sealing layer 8 is created on the common electrode 7. Next, the quantum dot layers 9 are created on the sealing layer 8. In this process, the quantum dot layer 91 is created as an upper layer above the light-emitting layer 51, the quantum dot layer 92 is created as an upper layer above the light-emitting layer 52, and the quantum dot layer 93 is created as an upper layer above the light-emitting layer 53. After the quantum dot layers 91 to 93 are created, an edge cover (not illustrated) may be created therebetween. Next, the color filters 10 are created on the quantum dot layers 9. In this process, the color filter 101 is created on the quantum dot layer 91, the color filter 102 is created on the quantum dot layer 92, and the color filter 103 is created on the quantum dot layer 93. Next, the functional film 11 is created on the color filters 10. This completes the manufacture of the display device 1.

In the example illustrated in FIG. 6, the quantum dot units 121 that are selectively bonded to the pixel electrodes 3 are used to selectively and respectively create the light-emitting layers 51 to 53 emitting the light of the same color. Thus, no partition needs to be formed around the pixel electrodes 31 to 33 for coloring the quantum dots 131 differently. Thus, a distance between the pixels can be made short, whereby the display device 1 featuring a high aperture ratio and a high brightness can be manufactured.

The order in which the pixels are created is not limited to the above-described example where the pixel P1, the pixel P2, and the pixel P3 are formed in this order. Thus, the order in which the pixels are created can be changed as appropriate. For example, the pixel P3 (blue pixel), the pixel P2 (green pixel), and the pixel P1 (red pixel) may be created in this order, or the pixel P2 (green pixel), the pixel P1 (red pixel), and the pixel P3 (blue pixel) may be created in this order.

In the present embodiment, after the pixel electrodes 31 to 33 are created, the light-emitting layers 51 to 53 may be created without creating the edge covers 4. In this case, the edge covers 4 are created after the light-emitting layers 51 to 53 are created. This enables the photolithography for creating the edge covers 4 to be performed more easily.

Second Embodiment

Figure 7:
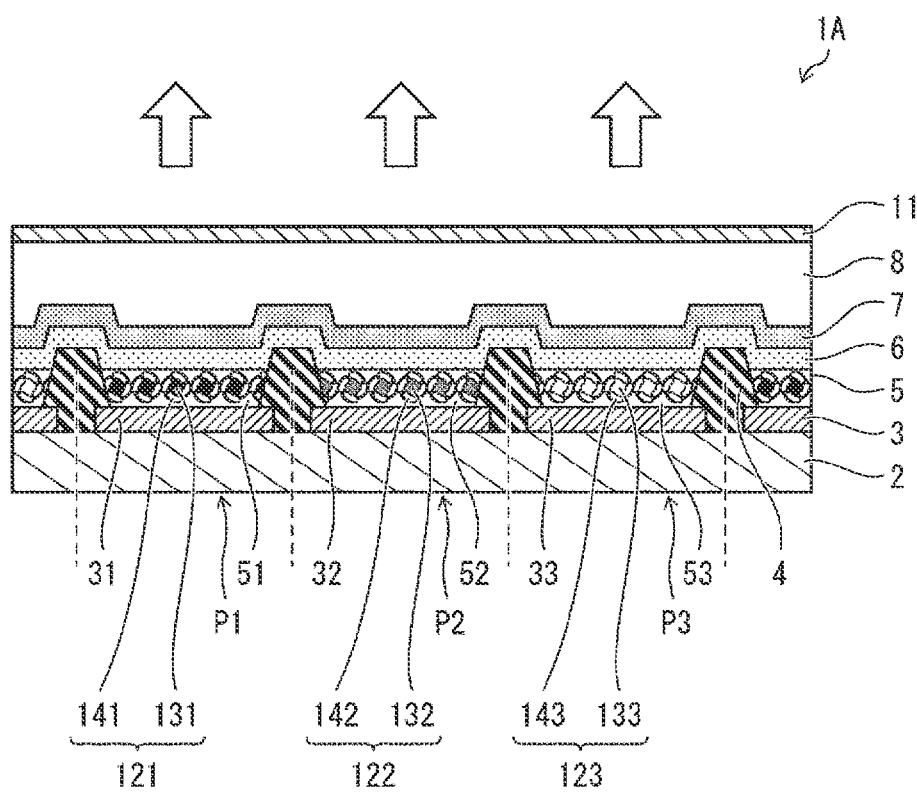
FIG. 7 is a cross-sectional view illustrating a cross section of a display device according to a second embodiment of the disclosure.

FIG. 7 is a cross-sectional view illustrating a cross section of a display device 1A according to a second embodiment of the disclosure. As illustrated in FIG. 7, the display device 1A includes the substrate 2, the pixel electrodes 3, the edge covers 4, the light-emitting layers 5, the carrier transport layer 6, the common electrode 7, the sealing layer 8, and the functional film 11. The basic configuration of the display device 1A is the same as that of the display device 1 according to the first embodiment. However, in the display device 1A, the configuration of the light-emitting layers 5 are different from those in the first embodiment. In other words, in the display device 1A, the configuration of the light-emitting layer 51, the light-emitting layer 52, and the light-emitting layer 53 is different. Specifically, while the light-emitting layer 51 includes the plurality of quantum dot units 121 as in the first embodiment, the light-emitting layer 52 includes a plurality of quantum dot units 122, and the light-emitting layer 53 includes a plurality of quantum dot units 123. In FIG. 7, the display device 1A does not include the quantum dot layers 9 or the color filters 10. Alternatively, the display device 1A may further include the quantum dot layers 9 and the color filters 10.

The quantum dots 131 included in the quantum dot units 121 are excited to emit blue light, when a carrier is injected into the quantum dots 131. The quantum dot units 122 each include a quantum dot 132 (second quantum dot) and ferritin 142 that covers the quantum dot 132. The quantum dot 132 is excited to emit green light, when a carrier is injected into the quantum dot 132. The quantum dot units 123 each include a quantum dot 133 (third quantum dot) and ferritin 143 that covers the quantum dot 133. The quantum dot 133 is excited to emit red light, when a carrier is injected into the quantum dot 133. As described above, in the display device 1A, the quantum dots included in the light-emitting layers 5 include the quantum dots 131, the quantum dots 132, and the quantum dots 133 that emit different colors. In the display device 1A with this configuration, the light-emitting layer 51, the light-emitting layer 52, and the light-emitting layer 53 can emit blue light, green light, and red light, respectively, through carrier injection. Thus, unlike in the first embodiment, the display device 1A does not necessarily need to be provided with the quantum dot layers 9 and the color filters 10.

In the display device 1A, the ferritin 141, the ferritin 142, and the ferritin 143 are the same ferritin. Thus, the ferritin 141, the ferritin 142, and the ferritin 143 are the same material for the pixel P1, the pixel P2, and the pixel P3. The pixel electrodes 3 are the same material for the pixel P1, the pixel P2, and the pixel P3 as in the first embodiment. Thus, with electrostatic interaction between the pixel electrode 31 and the peptide modifying the ferritin 141, the quantum dots 131 can be selectively disposed on the pixel electrode 31. Similarly, with electrostatic interaction between the pixel electrode 32 and the peptide modifying the ferritin 142, the quantum dots 132 can be selectively disposed on the pixel electrode 32. Furthermore, with electrostatic interaction between the pixel electrode 33 and the peptide modifying the ferritin 143, the quantum dots 133 can be selectively disposed on the pixel electrode 33. Thus, no partition needs to be formed around the pixel electrode 31 for coloring the quantum dots 131 separately. With the partition thus omitted, the display device 1A featuring a high aperture ratio and a high brightness can be obtained. Similarly, no partition needs to be formed around the pixel electrode 32 for coloring the quantum dots 132 separately, and no partition needs to be formed around the pixel electrode 33 for coloring the quantum dots 133 separately. Thus, with these partitions omitted, the display device 1A featuring a high aperture ratio and a high brightness can be obtained.

Figure 8:
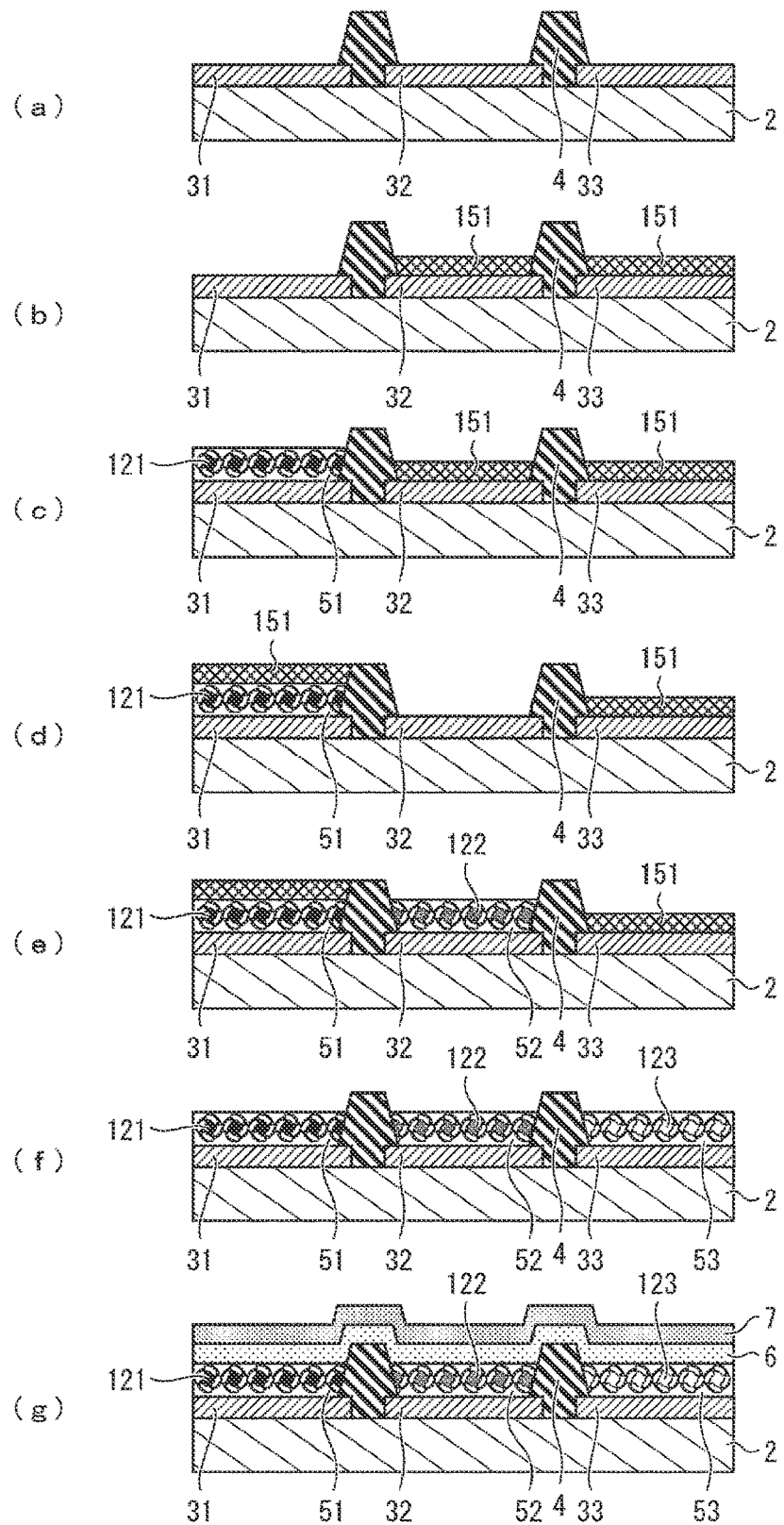
FIGS. 8(a) to (g) are diagrams illustrating a manufacturing method of the display device according to the second embodiment of the disclosure.

FIGS. 8(a) to (g) are diagrams illustrating a manufacturing method of the display device 1A according to the second embodiment of the disclosure. First of all, as illustrated in FIG. 8(a), the pixel electrodes 31 to 33 and the edge covers 4 are created on the substrate 2. The method of creating these is the same as that illustrated in FIGS. 6(a) and (b), and thus a detailed description thereof is not repeated. Next, as illustrated in FIG. 8(b), a resist 151 for masking the pixel electrodes 32 and 33 is created on the pixel electrodes 32 and 33. A method of creating the resist 151 is known, and thus a detailed description thereof will be omitted.

Next, as illustrated in FIG. 8(c), a solution including the quantum dot units 121 is applied on the pixel electrode 31. Thus, the quantum dots 131 emitting blue light are bonded to the pixel electrode 31 via a peptide modifying the ferritin 141. After being left for a while, and the excess solution is removed by centrifugal separation or the like. As a result, the light-emitting layer 51 including the quantum dots 131 is created on the pixel electrode 31. In this process, the pixel electrodes 32 and 33 are masked by the resist 151, meaning that no solution including the quantum dot units 121 comes into contact with the pixel electrode 32 or 33. Thus, the quantum dots 131 can be prevented from being unintentionally bonded to the pixel electrode 32 or 33, whereby the quantum dots 131 can be selectively applied on the pixel electrode 31. Note that when the quantum dot units 121 other than those on the pixel electrode 31 remain even after the centrifugal separation, the quantum dot units 121 that did not bond to the pixel electrode 31 are recovered by flushing the quantum dot units 121 using a cleaning fluid. The recovery of the quantum dot units 121 is synonymous with the recovery of the quantum dots 131 included in the quantum dot units 121. As a result, no quantum dot unit 121 remains outside a portion over the pixel electrode 31, whereby an impact on the later steps can be reduced. Furthermore, since the recovered quantum dot units 121 can be reused, the manufacturing costs of the display device 1A can be reduced. Then, the resist 151 on the pixel electrodes 32 and 33 is removed.

Next, as illustrated in FIG. 8(d), the resist 151 for masking the pixel electrodes 31 and 33 is created on the light-emitting layer 51 and the pixel electrode 33. Next, as illustrated in FIG. 8(e), a solution including the quantum dot units 122 is applied on the pixel electrode 32. Thus, the quantum dots 132 emitting green light are bonded to the pixel electrode 32 via a peptide modifying the ferritin 142. After being left for a while, the excess solution is removed by centrifugal separation or the like. As a result, the light-emitting layer 52 including the quantum dots 132 is created on the pixel electrode 32. In this process, since the light-emitting layer 51 and the pixel electrode 33 are masked by the resist 151, no solution including the quantum dot units 122 comes into contact with the light-emitting layer 51 or the pixel electrode 33. Thus, the quantum dots 132 can be prevented from being unintentionally bonded to the pixel electrode 31 or 33, whereby the quantum dots 132 can be selectively applied on the pixel electrode 32. Note that when the quantum dot units 122 other than those on the pixel electrode 32 remain even after the centrifugal separation, the quantum dot units 122 that did not bond to the pixel electrode 32 are recovered by flushing the quantum dot units 122 using a cleaning fluid. Then, the resist 151 on the light-emitting layer 51 and on the pixel electrode 33 is removed.

Next, as illustrated in FIG. 8(f), the light-emitting layer 53 including the quantum dots 133 is selectively created on the pixel electrode 33, using the same method as that for the light-emitting layer 51 and the light-emitting layer 52. The details of this process are omitted in the drawings. The following simply describes the procedure. The resist 151 for masking the pixel electrodes 31 and 32 is created on the light-emitting layers 51 and 52. Next, a solution including the quantum dot units 123 is applied on the pixel electrode 33. Thus, the quantum dots 133 emitting red light are bonded to the pixel electrode 33 via a peptide modifying the ferritin 143. After being left for a while, the excess solution is removed by centrifugal separation or the like. As a result, the light-emitting layer 53 including the quantum dots 133 is created on the pixel electrode 33. In this process, the pixel electrodes 31 and 32 are masked by the resist 151, meaning that no solution including the quantum dot units 123 comes into contact with the pixel electrode 31 or 32. Thus, the quantum dots 133 can be prevented from being unintentionally bonded to the pixel electrode 31 or 32, whereby the quantum dots 133 can be selectively applied on the pixel electrode 33. Note that when the quantum dot units 123 other than those on the pixel electrode 33 remain even after the centrifugal separation, the quantum dot units 123 that did not bond to the pixel electrode 33 are recovered by flushing the quantum dot units 123 using a cleaning fluid. Then, the resist 151 on the light-emitting layers 51 and 52 is removed.

Next, as illustrated in FIG. 8(g), the carrier transport layer 6 and the common electrode 7 are each created. A method of creating these is the same as in the first embodiment, and thus a detailed description thereof will be omitted. Thereafter, the sealing layer 8 and the functional film 11 are created, and the manufacture of the display device 1A is completed.

In the example in FIGS. 8(a) to (g), when the quantum dot units 121 are applied on the pixel electrode 31, the pixel electrodes 32 and 33 are masked by the resist 151 beforehand, and thus, no partition needs to be formed for coloring the quantum dots 131 on the pixel electrode 31 separately. Likewise, no partition needs to be formed for coloring the quantum dots 132 on the pixel electrode 32 separately, and no partition needs to be formed for coloring the quantum dots 133 on the pixel electrode 33 separately. Thus, the display device 1A featuring a high aperture ratio and a high brightness can be manufactured.

Also in the present embodiment, like in the first embodiment, after the pixel electrodes 31 to 33 are created, the light-emitting layers 51 to 53 may be created without creating the edge covers 4. In this case, the edge covers 4 are created after the light-emitting layers 51 to 53 are created.

This enables the photolithography for creating the edge covers 4 to be performed more easily.

Third Embodiment

Figure 9:
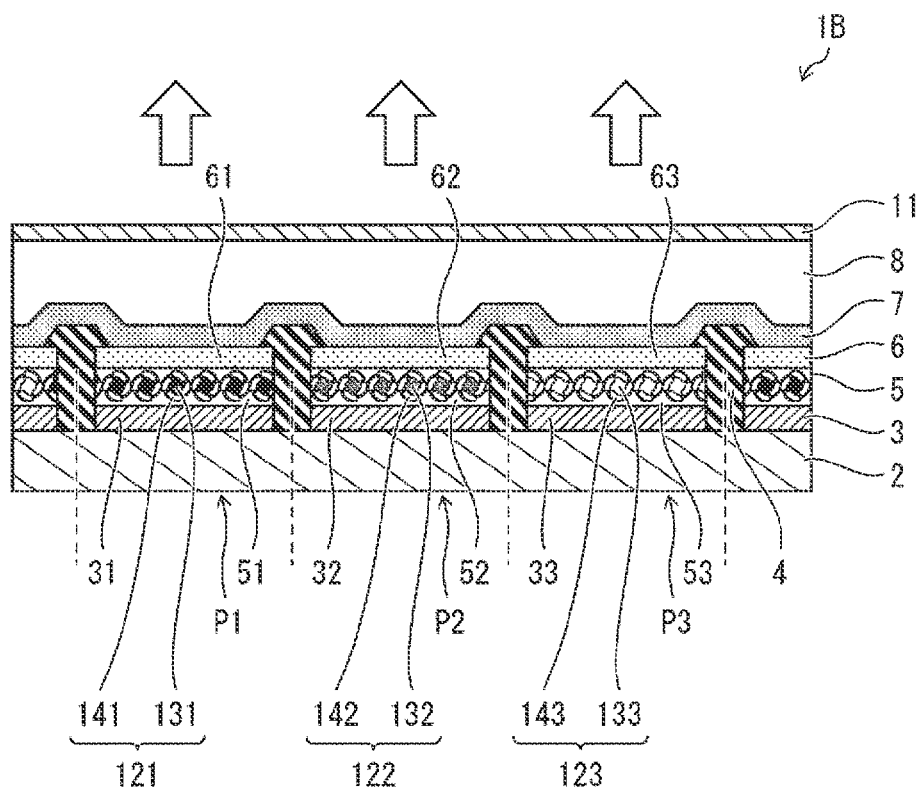
FIG. 9 is a cross-sectional view illustrating a cross section of a display device according to a third embodiment of the disclosure.

FIG. 9 is a cross-sectional view illustrating a cross section of a display device 1B according to a third embodiment of the disclosure. As illustrated in FIG. 9, the display device 1B includes the substrate 2, the pixel electrodes 3, the edge covers 4, the light-emitting layers 5, the carrier transport layers 6, the common electrode 7, the sealing layer 8, and the functional film 11. The basic configuration of the display device 1B is the same as that of the display device 1A according to the second embodiment. However, in the display device 1B, unlike the display device 1A, the carrier transport layers 6 are provided to be in an island shape in a shape corresponding to each pixel. Specifically, the carrier transport layers 6 include a carrier transport layer 61 (first carrier transport layer), a carrier transport layer 62 (second carrier transport layer), and a carrier transport layer 63 (third carrier transport layer). The carrier transport layer 61 is provided to the pixel P1, the carrier transport layer 62 is provided to the pixel P2, and the carrier transport layer 63 is provided to the pixel P3. In the pixel P1, the carrier transport layer 61 is sandwiched between the light-emitting layer 51 and the common electrode 7. In the pixel P2, the carrier transport layer 62 is sandwiched between the light-emitting layer 52 and the common electrode 7. In the pixel P3, the carrier transport layer 63 is sandwiched between the light-emitting layer 53 and the common electrode 7.

Manufacturing Method

Figure 10:
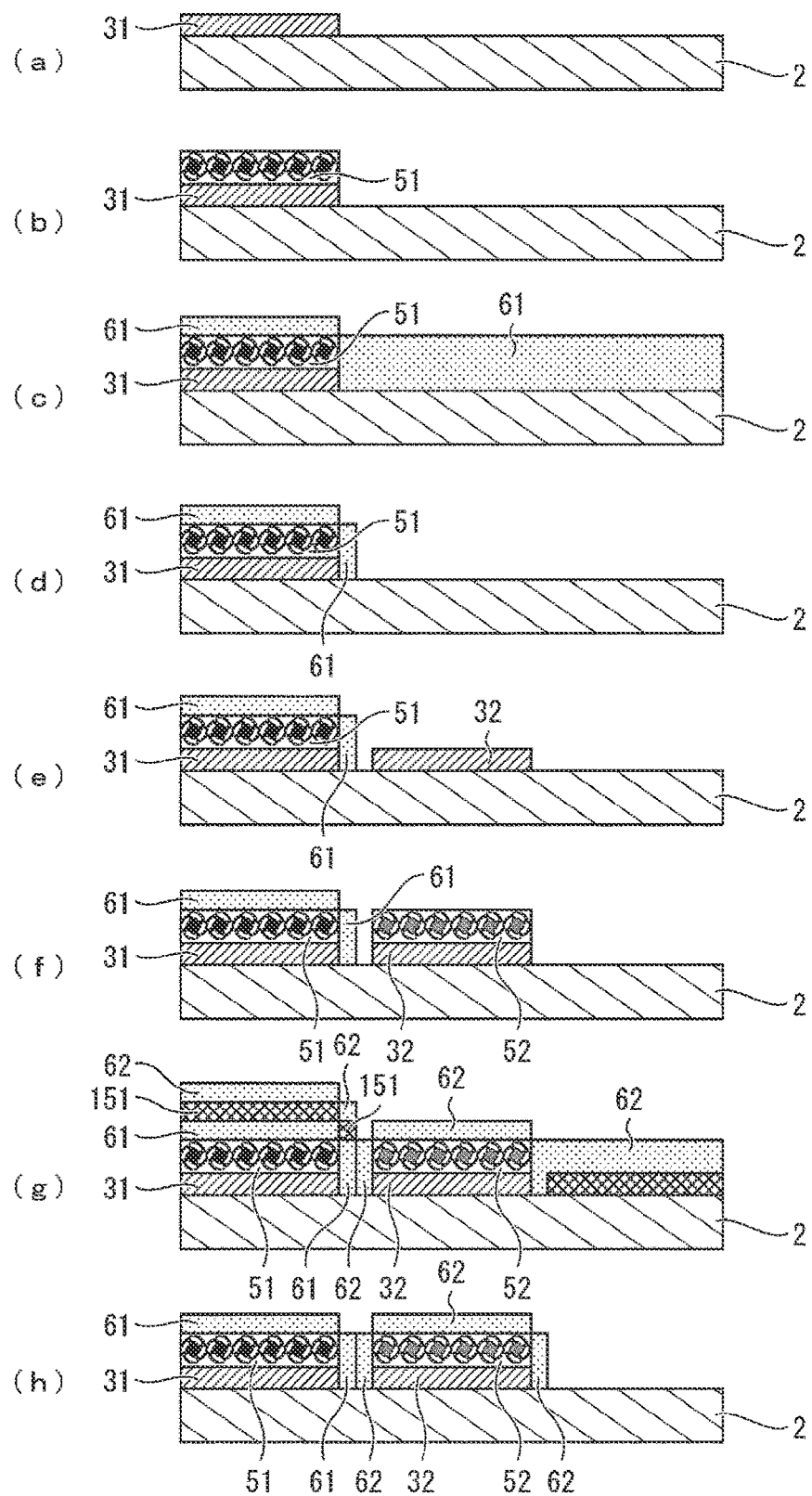
FIGS. 10(a) to (h) are diagrams illustrating a manufacturing method of the display device according to the third embodiment of the disclosure.

FIGS. 10(a) to (h) and FIGS. 11(a) to (e) are diagrams illustrating a manufacturing method of the display device 1B according to the third embodiment of the disclosure. First of all, as illustrated in FIG. 10(a), out of the pixel electrode 31, the pixel electrode 32, and the pixel electrode 33, only the pixel electrode 31 is created on the substrate 2. In this process, for example, the pixel electrode 31 is created on the substrate 2 by vapor deposition using a photomask, sputtering, or the like using titanium as the material.

Next, as illustrated in FIG. 10(b), a solution including the quantum dot units 121 is applied on the pixel electrode 31. Thus, the quantum dots 131 emitting blue light are bonded to the pixel electrode 31 via a peptide modifying the ferritin 141. After being left for a while, the excess solution is removed by centrifugal separation or the like. As a result, the light-emitting layer 51 including the quantum dots 131 is created on the pixel electrode 31.

Next, as illustrated in FIG. 10(c), the carrier transport layer 61 is created on the light-emitting layer 51 and on a portion of the substrate 2 where the pixel electrode 31 is not created. A method of creating the carrier transport layer 61 is the same as in the first embodiment and the like, and thus a detailed description thereof will be omitted. In this step, the carrier transport layer 61 is also created around the light-emitting layer 51, as well as on the pixel electrode 31.

Next, as illustrated in FIG. 10(d), the excess part of the carrier transport layer 61 other than the part of carrier transport layer 6 corresponding to the pixel P1 is removed by photolithography and etching. As a result, the carrier transport layer 61 created on the light-emitting layer 51 and the carrier transport layer 61 created around the pixel electrode 31 remain.

Next, as illustrated in FIG. 10(e), out of the pixel electrode 32 and the pixel electrode 33, only the pixel electrode 32 is created on the substrate 2. In this process, for example, the pixel electrode 32 is created on the substrate 2 by vapor deposition using a photomask, sputtering, or the like using titanium as the material.

Next, as illustrated in FIG. 10(f), a solution including the quantum dot units 122 is applied on the pixel electrode 32. Thus, the quantum dots 132 emitting green light are bonded to the pixel electrode 32 via a peptide modifying the ferritin 142. After being left for a while, the excess solution is removed by centrifugal separation or the like. As a result, the light-emitting layer 52 including the quantum dots 132 is created on the pixel electrode 32. In this process, the carrier transport layer 61 is created on the light-emitting layer 51, and thus the solution including the quantum dot units 122 is not applied to the light-emitting layer 51. Thus, no quantum dots 132 remain on the light-emitting layer 51.

Next, as illustrated in FIG. 10(g), the resist 151 is formed at a portion of the substrate 2 other than the pixel P2. Specifically, the resist 151 is formed on the light-emitting layer 51 in the pixel P1 and at a portion of the substrate 2 on which the pixel electrode 33 is to be created. Then, the carrier transport layer 62 is created across the entire surface of the substrate 2. A method of creating the carrier transport layer 62 is the same as in the first embodiment and the like, and thus a detailed description thereof will be omitted. In FIG. 10(g), the carrier transport layer 62 is created on the resist 151 and on the light-emitting layer 52.

Next, as illustrated in FIG. 10(h), lift-off of the resist 151 and the carrier transport layer 62 at a portion other than the pixel P2 is performed, whereby the carrier transport layer 62 is left only in the pixel P2. In other words, in the pixels P1 and P3, the resist 151 and the carrier transport layer 62 created on the resist 151 are removed. As a result, the carrier transport layer 62 created on the light-emitting layer 52 and the carrier transport layer 62 created around the pixel electrode 32 remain.

Figure 11:
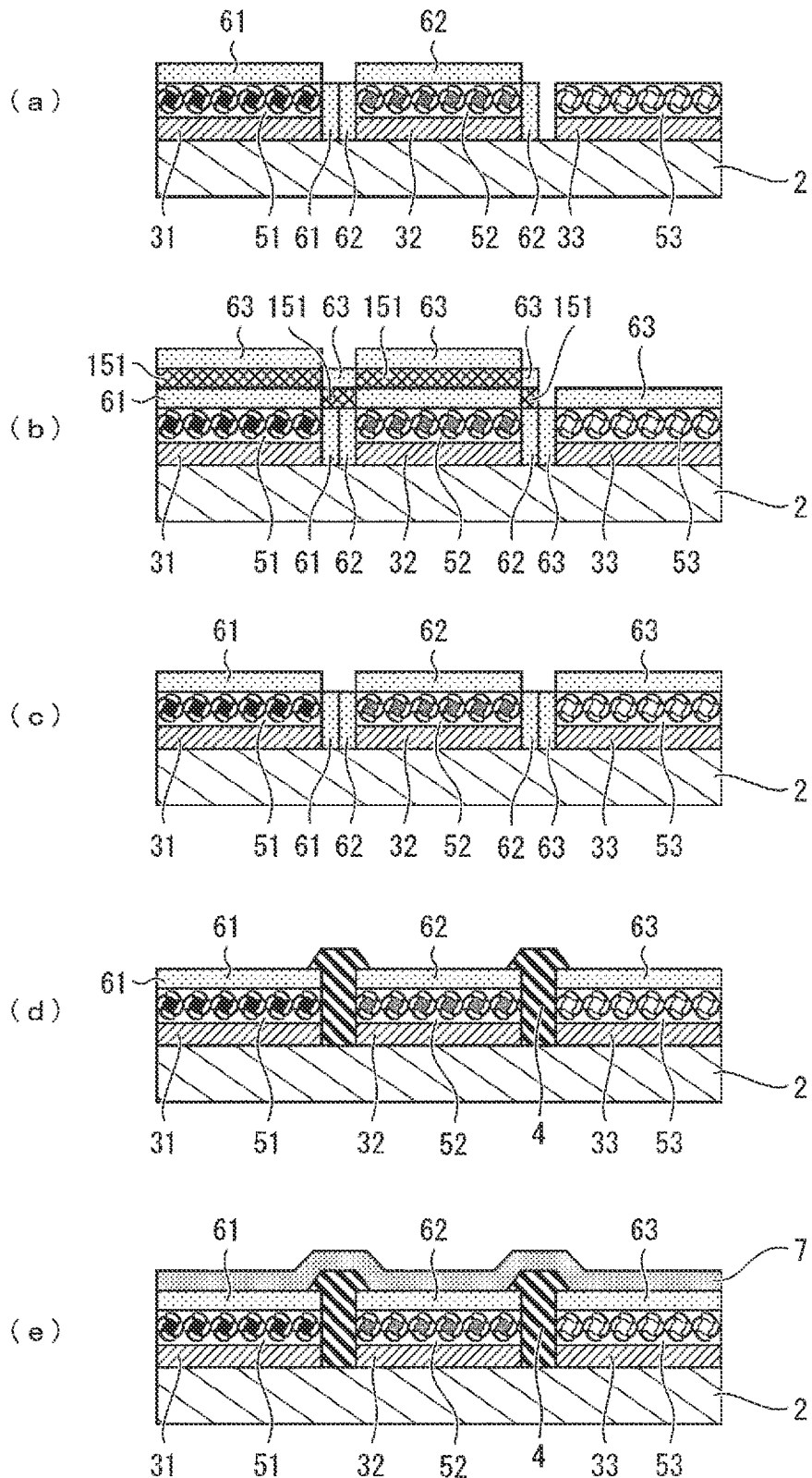
FIGS. 11(a) to (e) are diagrams illustrating the manufacturing method of the display device according to the third embodiment of the disclosure.

Next, as illustrated in FIG. 11(a), the pixel electrode 33 is created on the substrate 2. In this process, for example, the pixel electrode 33 is created on the substrate 2 by vapor deposition using a photomask, sputtering, or the like using titanium as the material. Then, a solution including the quantum dot units 123 is applied on the pixel electrode 33. Thus, the quantum dots 133 emitting red light are bonded to the pixel electrode 33 via a peptide modifying the ferritin 143. After being left for a while, the excess solution is removed by centrifugal separation or the like. As a result, the light-emitting layer 53 including the quantum dots 133 is created on the pixel electrode 33. In this process, the carrier transport layer 61 is created on the light-emitting layer 51, and thus the solution including the quantum dot units 123 is not applied to the light-emitting layer 51. Thus, no quantum dots 133 remain on the light-emitting layer 51. Similarly, the carrier transport layer 62 is created on the light-emitting layer 52, and thus the solution including the quantum dot units 123 is not applied to the light-emitting layer 52. Thus, no quantum dots 133 remain on the light-emitting layer 52.

Next, as illustrated in FIG. 11(b), the resist 151 is formed at a portion of the substrate 2 other than the pixel P3. Specifically, the resist 151 is formed on the carrier transport layer 61 in the pixel P1 and on the carrier transport layer 62 in the pixel P2. Then, the carrier transport layer 63 is created across the entire surface of the substrate 2. A method of creating the carrier transport layer 63 is the same as in the first embodiment and the like, and thus a detailed description thereof will be omitted. In FIG. 11(b), the carrier transport layer 63 is created on the resist 151 and on the light-emitting layer 53.

Next, as illustrated in FIG. 11(c), lift-off of the resist 151 and the carrier transport layer 63 at a portion other than the pixel P3 is performed, whereby the carrier transport layer 63 is left only in the pixel P3. In other words, in the pixels P1 and P2, the resist 151 and the carrier transport layer 63 created on the resist 151 are removed. As a result, the carrier transport layer 62 created on the light-emitting layer 53 and the carrier transport layer 62 created around the pixel electrode 33 remain.

Next, as illustrated in FIG. 11(d), the edge covers 4 are created between the pixel electrodes 3. In this process, the carrier transport layer 6 between the pixel electrodes 3 first is removed by etching, and then the edge covers 4 are created between the pixel electrodes 3 by photolithography. In FIG. 11(d), the edge covers 4 are respectively created between the pixel electrode 31 and the pixel electrode 32, and between the pixel electrode 32 and the pixel electrode 33. Although not illustrated, the edge cover 4 is also created between the pixel electrode 33 and the pixel electrode 31.

Next, as illustrated in FIG. 11(e), the common electrode 7 is created on the carrier transport layer 6. A method of creating the common electrode 7 is the same as in the first embodiment and the like, and thus a detailed description thereof will be omitted. Thereafter, the sealing layer 8 and the functional film 11 are each created, and the manufacture of the display device 1B is completed.

In the present embodiment, since the pixel electrode 3, the light-emitting layer 5, and the carrier transport layer 6 are individually created for each color, the quantum dots 131 to 133 in the respective pixels can be colored separately without forming a partition. Thus, the display device 1B featuring a high aperture ratio and a high brightness can be manufactured.

In the present embodiment, the pixel electrodes 3 may be created on the substrate 2, in the order of the pixel electrode 33, the pixel electrode 32, and the pixel electrode 31. In this example, the carrier transport layers 62 and 61 may be created without using the resist 151, after the carrier transport layer 63 has been created. Specifically, when the carrier transport layer 63 that is thin is created on the light-emitting layer 53 and then the carrier transport layer 62 is created, the carrier transport layer 62 that is thin is created on the carrier transport layer 63 and on the light-emitting layer 52 without creating the resist 151 on the carrier transport layer 63. As a result, the carrier transport layer 62 is newly layered on the carrier transport layer 63. This means that the thickness of the carrier transport layer 63 increases because the materials of the carrier transport layer 62 and the carrier transport layer 63 are the same. Similarly, when the carrier transport layer 62 is created and then the carrier transport layer 61 is created, the thin carrier transport layer 61 is formed on each of the carrier transport layer 63, the carrier transport layer 62, and the light-emitting layer 51 without forming the resist 151 on the carrier transport layers 63 and 62. As a result, the carrier transport layer 61 is further layered on the carrier transport layer 63, and the carrier transport layer 61 is layered on the carrier transport layer 62. This means that, because the materials of the carrier transport layer 61 and the carrier transport layers 62 and 63 are the same, the thickness of the carrier transport layer 63 increases and the thickness of the carrier transport layer 62 also increases.

In the above example, the thickness of the carrier transport layer 6 satisfies the following relationship: carrier transport layer 63>carrier transport layer 62>carrier transport layer 61. Thus, the resistance of the carrier transport layer 61 of the pixel P1 that displays blue is lower than the resistance of the carrier transport layers 6 of the other pixels P2 and P3. In the pixel P1 that displays blue, the electron bandgap is larger than those in the other pixels P2 and P3. Thus, the resistance of the carrier transport layer 63 in the pixel P1 for displaying blue is preferably made small with the carrier transport layer 6 configured as in the present example.

Fourth Embodiment

Figure 12:
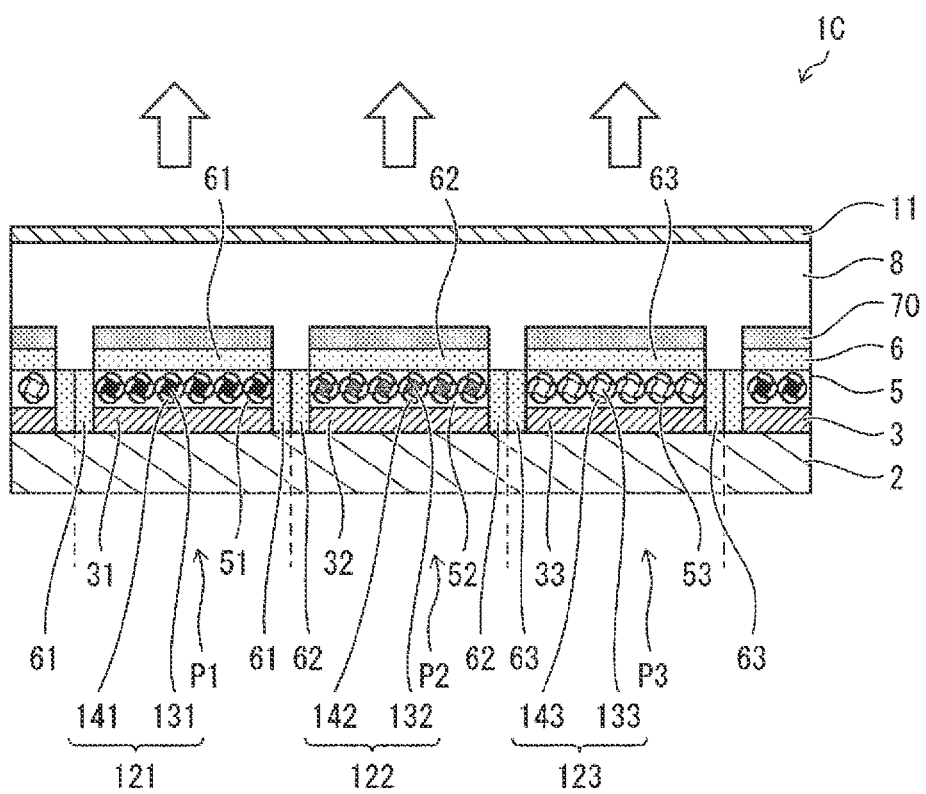
FIG. 12 is a cross-sectional view illustrating a cross section of a display device according to a fourth embodiment of the disclosure.

FIG. 12 is a cross-sectional view illustrating a cross section of a display device 1C according to a fourth embodiment of the disclosure. As illustrated in FIG. 12, the display device 1C includes the substrate 2, the pixel electrodes 3, the light-emitting layer 5, the carrier transport layer 6, a transparent electrode 70, the sealing layer 8, and the functional film 11. The basic configuration of the display device 1C is the same as that of the display device 1B according to the third embodiment. However, the display device 1C includes, instead of the common electrode 7, the transparent electrodes 70 provided, in an island shape, to respective pixels. The transparent electrodes 70 are not common to the plurality of pixel electrodes 3, but one transparent electrode 70 corresponds to only one pixel electrode 3. The role of the transparent electrodes 70 is the same as the role of the common electrode 7.

Furthermore, the display device 1C is different from the display device 1B in that the edge covers 4 are not provided. Instead, in the display device 1C, the carrier transport layer 6 is formed to have portions covering end portions of the pixel electrodes 3, and thus the carrier transport layer 6 also serves as the edge cover. Thus, the concentration of the electric field between the pixel electrodes 3 can be suppressed.

Specifically, the carrier transport layer 61 exposes upper portions of the pixel electrodes 32 and 33, and covers end portions of the pixel electrodes 32 and 33. The carrier transport layer 62 exposes upper portions of the pixel electrodes 31 and 33, and covers end portions of the pixel electrodes 31 and 33. The carrier transport layer 63 exposes upper portions of the pixel electrodes 31 and 32, and covers end portions of the pixel electrodes 31 and 32. In other words, a portion of the carrier transport layer 61 is provided around the pixel electrode 31, and thus serves as an edge cover that partitions the pixel electrode 31 from the pixel electrodes 32 and 33. A portion of the carrier transport layer 62 is provided around the pixel electrode 32, and thus serves as an edge cover that partitions the pixel electrode 32 from the pixel electrodes 31 and 33. A portion of the carrier transport layer 63 is provided around the pixel electrode 33, and thus serves as an edge cover that partitions the pixel electrode 33 from the pixel electrodes 31 and 32.

Figure 13:
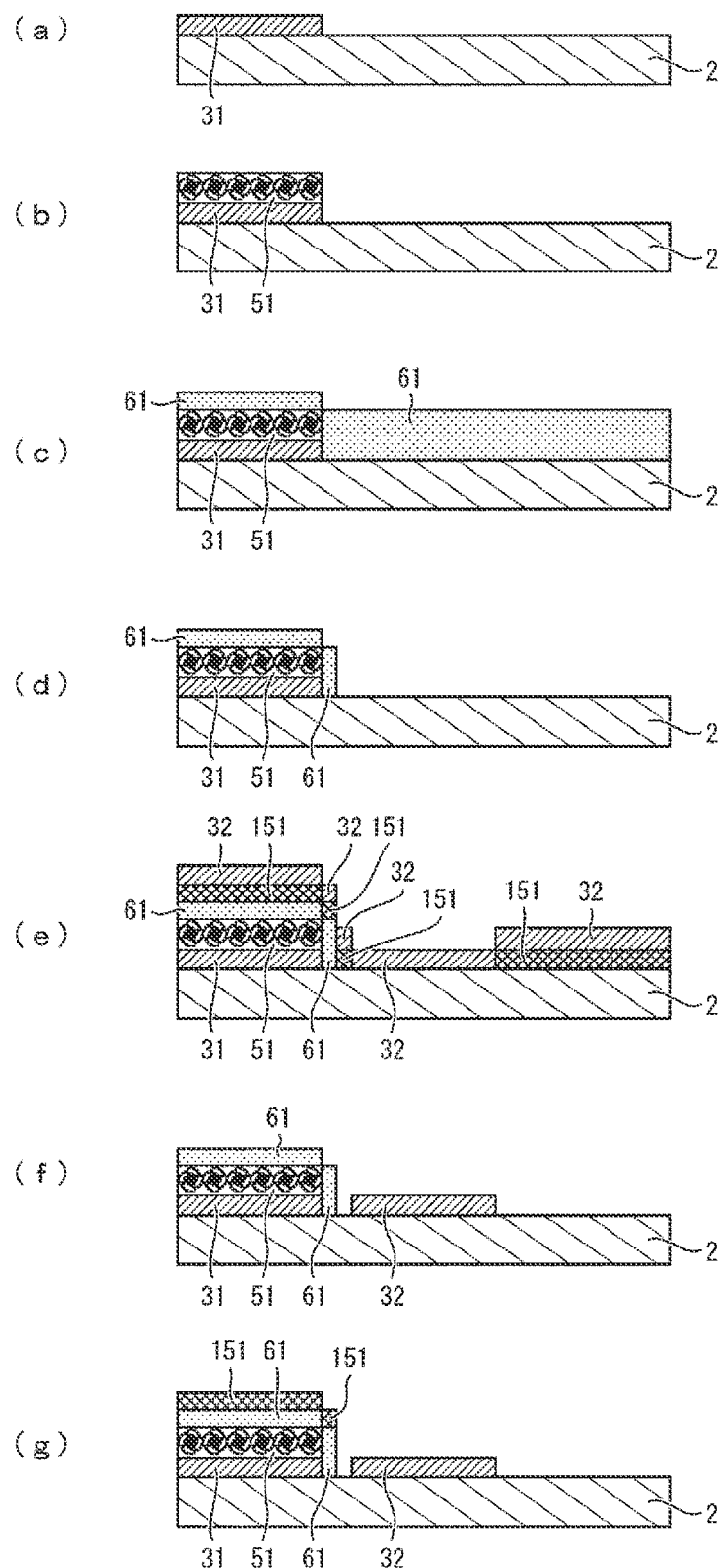
FIGS. 13(a) to (g) are diagrams illustrating a manufacturing method of the display device according to the fourth embodiment of the disclosure.

FIGS. 13(a) to (g) and FIGS. 14(a) to (g) are diagrams illustrating a manufacturing method of the display device 1C according to the fourth embodiment of the disclosure. First of all, as illustrated in FIGS. 13(a) to (d), the pixel electrodes 31, the light-emitting layer 51, and the carrier transport layer 61 are created on the substrate 2. The procedure for these is the same as that illustrated in FIGS. 10(a) to (d), and thus a detailed description thereof is not repeated. In FIG. 13(d), the carrier transport layer 61 is created on the light-emitting layer 51 and around the pixel electrode 31. The thickness of the carrier transport layer 61 may be the same as a total of the thickness of the pixel electrode 31 and the thickness of the light-emitting layer 51, and may be, for example, approximately 100 nm.

Next, as illustrated in FIG. 13(e), the resist 151 is formed at a portion of the substrate 2 other than the pixel P2.

Specifically, the resist 151 is formed on the carrier transport layer 61 in the pixel P1 and at a portion of the substrate 2 on which the pixel P3 is to be created by photolithography. Then, the pixel electrode 32 is created across the entire surface of the substrate 2. In this process, for example, the pixel electrode 32 is created on the substrate 2 by vapor deposition using a photomask, sputtering, or the like using titanium as the material. In this process, since the carrier transport layer 61 formed of the inorganic material is created on the light-emitting layer 51, damage on the light-emitting layer 51 when the pixel electrode 32 is created can be suppressed by the carrier transport layer 61 (barrier effect).

Next, as illustrated in FIG. 13(f), lift-off of the resist 151 and the pixel electrode 32 at a portion other than the pixel P2 is performed, whereby the pixel electrode 32 is left only in the pixel P2. In other words, in the pixels P1 and P3, the resist 151 and the pixel electrode 32 created on the resist 151 are removed. This allows the pixel electrode 32 to be created in only the pixel P2.

Figure 14:
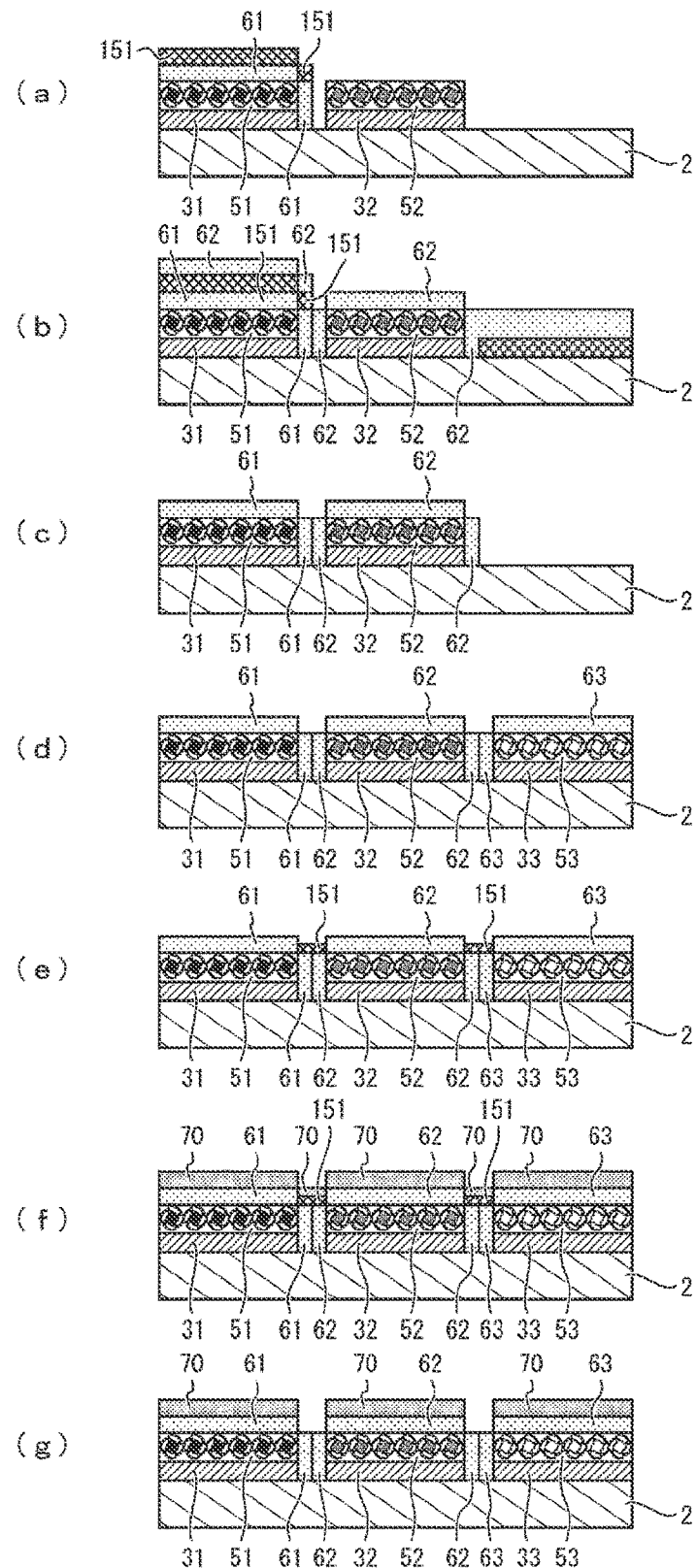
FIGS. 14(a) to (g) are diagrams illustrating the manufacturing method of the display device according to the fourth embodiment of the disclosure.

Next, as illustrated in FIG. 13(g), the resist 151 is formed again on the carrier transport layer 61. Next, as illustrated in FIG. 14(a), a solution including the quantum dot units 122 is applied on the pixel electrode 32. Thus, the quantum dots 132 emitting green light are bonded to the pixel electrode 32 via a peptide modifying the ferritin 142. After being left for a while, the excess solution is removed by centrifugal separation or the like. As a result, the light-emitting layer 52 including the quantum dots 132 is created on the pixel electrode 32. In this process, the resist 151 is created on the light-emitting layer 51, and thus the solution including the quantum dot units 122 is not applied to the light-emitting layer 51. Thus, no quantum dots 132 remain on the light-emitting layer 51.

Next, as illustrated in FIG. 14(b), the resist 151 is formed at a portion of the substrate 2 where the pixel electrode 33 is to be created. Then, the carrier transport layer 62 is created across the entire surface of the substrate 2. A method of creating the carrier transport layer 62 is the same as in the first embodiment and the like, and thus a detailed description thereof will be omitted. In FIG. 14(b), the carrier transport layer 62 is created on the resist 151 and on the light-emitting layer 52.

Next, as illustrated in FIG. 14(c), lift-off of the resist 151 and the carrier transport layer 62 at a portion other than the pixel P2 is performed, whereby the carrier transport layer 62 is only left in the pixel P2. In other words, in the pixels P1 and P3, the resist 151 and the carrier transport layer 62 created on the resist 151 are removed. As a result, the carrier transport layer 62 created on the light-emitting layer 52 and the carrier transport layer 62 created around the pixel electrode 32 remain.

Next, as illustrated in FIG. 14(d), the pixel electrode 33, the light-emitting layer 53, and the carrier transport layer 63 are each created. A procedure for creating these is basically the same as that for the pixel electrode 32, the light-emitting layer 52, and the carrier transport layer 62 according to the present embodiment, and thus a detailed description thereof will be omitted.

Next, as illustrated in FIG. 14(e), the resist 151 is created between the pixel electrodes 3. In FIG. 14(e), the resist 151 is formed between the pixel electrode 31 and the pixel electrode 32 and between the pixel electrode 32 and the pixel electrode 33. Although not illustrated, the resist 151 is also formed between the pixel electrode 33 and the pixel electrode 31.

Next, as illustrated in FIG. 14(f), a transparent electrode 70 is created on the carrier transport layers 6 and the resist 151. Next, as illustrated in FIG. 14(g), lift-off of the resist 151 and the transparent electrode 70 between the pixel electrodes 3 is performed, whereby the transparent electrodes 70 are created in an island shape for respective pixels. In other words, in FIG. 14(g), the transparent electrodes 70 created for respective pixels are physically separated from each other. Thereafter, the sealing layer 8 and the functional film 11 are each created, and the manufacture of the display device 1C is completed.

In the present embodiment, since the pixel electrode 3, the light-emitting layer 5, and the carrier transport layer 6 are individually created for each color, the quantum dots 131 to 133 in the respective pixels can be colored separately without forming a partition. Thus, the display device 1C featuring a high aperture ratio and a high brightness can be manufactured.

In the present embodiment, a portion of the carrier transport layers 61 to 63 is created around the pixel electrodes 31 to 33, so that the portion can function as the edge cover. Thus, the edge covers 4 do not need to be created separately. Note that, in the present embodiment, the edge covers 4 may be created separately from the carrier transport layers 6 in the present embodiment, as in the other embodiments.

Figure 15:
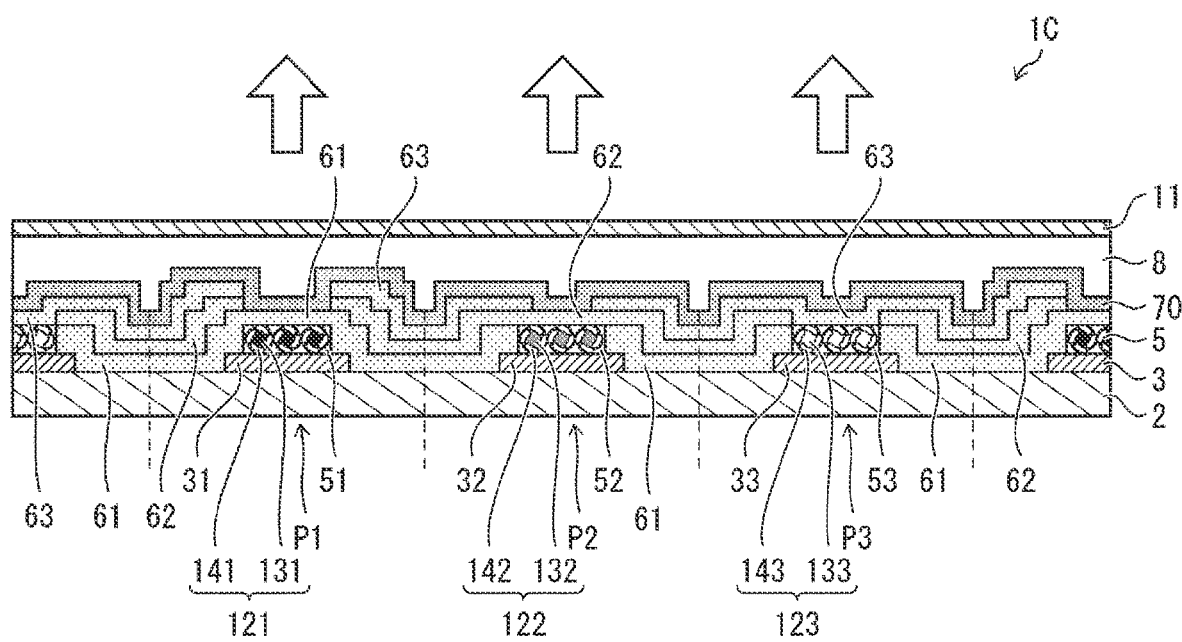
FIG. 15 is a cross-sectional view illustrating a cross section of another display device according to the fourth embodiment of the disclosure.

FIG. 15 is a cross-sectional view illustrating a cross section of another display device 1C according to the fourth embodiment of the disclosure. The display device 1C may be a device having a structure as illustrated in FIG. 15. In the example illustrated in FIG. 15, in the display device 1C, the carrier transport layer 6 that has a three-layer structure in which the carrier transport layers 61, 62, and 63 are layered around the pixel electrodes 31 to 33 is formed. Thus, the carrier transport layer 6 having the three-layer structure can function as the edge covers, and thus the edge covers 4 do not need to be separately created. Furthermore, the carrier transport layer 6 disposed around the pixel electrodes 31 to 33 has the three-layer structure in which the carrier transport layers 61, 62, and 63 are layered, and thus has a sufficiently large thickness. Thus, with the carrier transport layer 6 functioning as the edge cover, two adjacent pixel electrodes 3 can be sufficiently partitioned.

Fifth Embodiment

Figure 16:
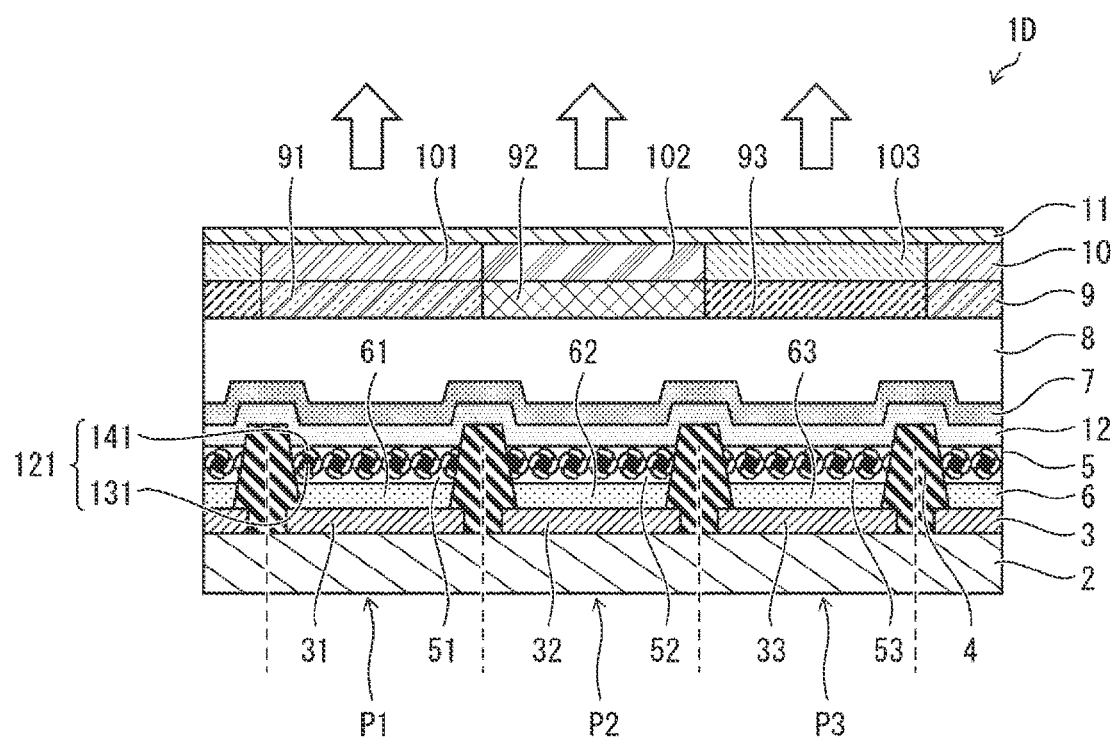
FIG. 16 is a cross-sectional view illustrating a cross section of a display device according to a fifth embodiment of the disclosure.

FIG. 16 is a cross-sectional view illustrating a cross section of a display device 1D according to a fifth embodiment of the disclosure. As illustrated in FIG. 16, the display device 1D includes the substrate 2, the pixel electrodes 3, the light-emitting layers 5, the carrier transport layers 6, the common electrode 7, the sealing layer 8, the quantum dot layers 9, the color filters 10, the functional film 11, and a carrier transport layer 12. The basic configuration of the display device 1D is the same as that of the display device 1 according to the first embodiment. However, in the display device 1D, the carrier transport layers 6 are provided on the pixel electrodes 3, and furthermore the light-emitting layers 5 are provided on the carrier transport layers 6. In other words, the positional relationship with the carrier transport layers 6 differs from that of the display device 1. The carrier transport layers 6 include the carrier transport layer 61, the carrier transport layer 62, and the carrier transport layer 63. The display device 1D further includes the carrier transport layer 12 provided on the light-emitting layers 5.

In the example in FIG. 16, the pixel P1 includes the pixel electrode 31, the carrier transport layer 61, the light-emitting layer 51, the carrier transport layer 12, the common electrode 7, the quantum dot layer 91, and the color filter 101. The pixel P2 includes the pixel electrode 32, the carrier transport layer 62, the light-emitting layer 52, the carrier transport layer 12, the common electrode 7, the quantum dot layer 92, and the color filter 102. The pixel P3 includes the pixel electrode 33, the carrier transport layer 63, the light-emitting layer 53, the carrier transport layer 12, the common electrode 7, the quantum dot layer 93, and the color filter 103. In the pixel P1, the light-emitting layer 51 and the carrier transport layer 6 are sandwiched between the pixel electrode 31 and the common electrode 7. In the pixel P2, the light-emitting layer 52 and the carrier transport layer 6 are sandwiched between the pixel electrode 32 and the common electrode 7. In the pixel P3, the light-emitting layer 53 and the carrier transport layer 6 are sandwiched between the pixel electrode 33 and the common electrode 7.

The material of the carrier transport layer 6 is a substance that is capable of bonding to a peptide modifying the ferritin 141, and in the present embodiment is zinc oxide. The peptide modifying the ferritin 141 is a peptide that is capable of bonding to zinc oxide. As a result, known band configurations can be used in each of the pixels P1 to P3. In the display device 1D, the carrier transport layers 6 and the quantum dots 131 are bonded via the peptide modifying the ferritin 141. The quantum dots 131 are two-dimensionally arranged on each of the carrier transport layers 61 to 63 through this bonding. In other words, the light-emitting layers 51 to 53 including the quantum dots 131 are provided on the respective carrier transport layers 61 to 63.

Figure 17:
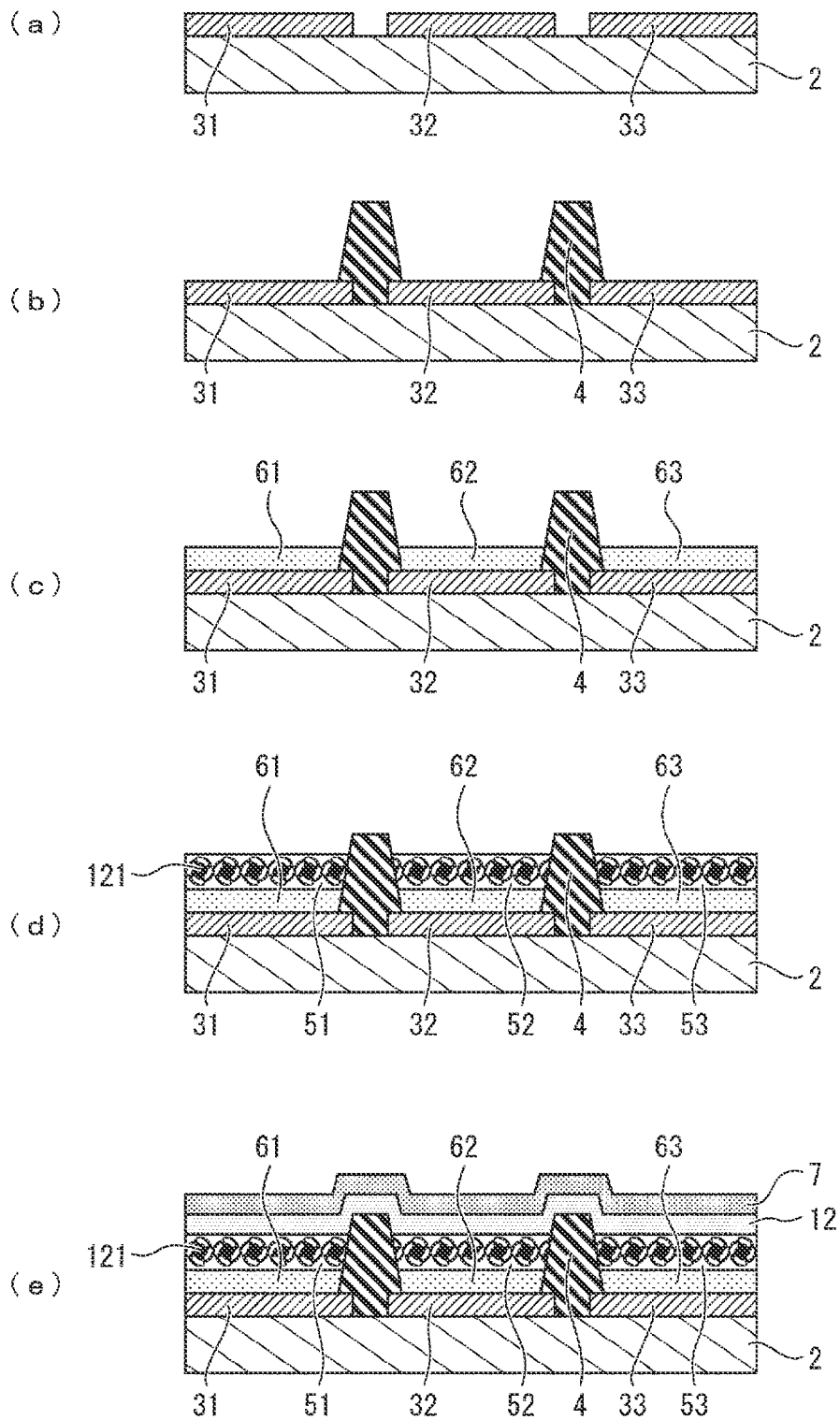
FIGS. 17(a) to (e) are diagrams illustrating the manufacturing method of the display device according to the fifth embodiment of the disclosure.

FIGS. 17(a) to (e) are diagrams illustrating a manufacturing method of the display device 1D according to the fifth embodiment of the disclosure. First of all, as illustrated in FIG. 17(a), the plurality of pixel electrodes 31, 32, and 33 are created on the substrate 2. Next, as illustrated in FIG. 17(b), the edge covers 4 are respectively created between the pixel electrodes 3. The procedure for creating these is the same as that illustrated in FIGS. 6(a) and (b), and thus a detailed description thereof will be omitted.

Next, as illustrated in FIG. 17(c), the carrier transport layers 61 to 63 are created on the pixel electrodes 31 to 33 by sputtering or coating and sintering, using zinc oxide as the material. Next, as illustrated in FIG. 17(d), a solution including the quantum dot units 121 is applied on the pixel electrodes 31 to 33. Here, the quantum dots 131 included in the quantum dot unit 121 are assumed to be quantum dots that emit near-ultraviolet light. Further, the ferritin 141 covering the quantum dots 131 in quantum dot unit 121 is assumed to be ferritin that has been modified with a peptide for recognizing zinc oxide. After being left for a while, the excess solution is removed by centrifugal separation or the like. As a result, the light-emitting layer 51 is created on the carrier transport layer 61, the light-emitting layer 52 is created on the carrier transport layer 62, and the light-emitting layer 53 is created on the carrier transport layer 63. In this process, the ferritin 141 included in the quantum dot unit 121 is bonded with the zinc oxide material of the carrier transport layers 61 to 63, but not with the material of the edge covers 4. Thus, when the solution is removed, the quantum dot units 121 remain on the carrier transport layers 61 to 63 in the bonded state. As a result, the light-emitting layers 51 to 53 can be selectively created on the carrier transport layers 61 to 63, respectively.

Next, as illustrated in FIG. 17(e), the carrier transport layer 12 and the common electrode 7 are each created. The carrier transport layer 12 is the same layer as the carrier transport layer 6 according to the first embodiment. Thus, the procedure for creating the carrier transport layer 12 and the common electrode 7 is the same as that in the first embodiment, and thus a detailed description thereof will be omitted. Thereafter, the sealing layer 8, the quantum dot layers 91, the color filters 10, and the functional film 11 are each created, and the manufacture of the display device 1D is completed.

In the present embodiment, with electrostatic interaction between the carrier transport layers 61 to 63 and the peptide modifying the ferritin 141, the quantum dots 131 can be selectively disposed on the carrier transport layers 61 to 63. Thus, no partition needs to be formed around the pixel electrodes 31 to 33 for coloring the quantum dots 131 separately. With the partition thus omitted, the display device 1D featuring a high aperture ratio and a high brightness can be obtained.

In the fifth embodiment, an example is described where the carrier transport layers 6 are respectively formed in an island shape for the pixel electrodes 3, and the light-emitting layers 5 including the quantum dot units 121 are also formed in an island shape on the carrier transport layers 6. Alternatively, the carrier transport layer 6 may be formed to be common (solid) to the plurality of pixel electrodes 3, as is the common electrode 7. In this case, the light-emitting layer 5 including the quantum dot units 121 is also formed to be common (solid) to a plurality of common electrodes 7, on the carrier transport layer 6. Also in this example, a light-emitting region is defined by the overlapping region between the pixel electrodes 3, the light-emitting layer 5, and the common electrodes 7, exposed through openings of the edge covers 4.

Supplement

A display device according to a first aspect of the disclosure includes: a plurality of pixel electrodes; a common electrode common to the plurality of pixel electrodes; and a light-emitting layer sandwiched between the plurality of pixel electrodes and the common electrode, in which the light-emitting layer includes quantum dots covered by ferritin, and each of the plurality of pixel electrodes and the quantum dots are bonded via a peptide modifying the ferritin.

A display device according to a second aspect of the disclosure, according to the first aspect, includes: a first pixel configured to emit light of a first color; and a second pixel configured to emit light of a second color having a longer wavelength than the first color, in which the quantum dots are the same material for the first pixel and the second pixel, and the second pixel includes, as an upper layer above the common electrode, a second color conversion layer configured to emit light of the second color through photoexcitation using light of the first color.

In a display device according to a third aspect of the disclosure, according to the first or second aspect, the first color is blue, and the first pixel includes, as an upper layer above the common electrode, a blue conversion layer configured to emit light of the blue through photoexcitation using light of the first color.

In a display device according to a fourth aspect of the disclosure, according to the first or second aspect, a color of light emitted by the light-emitting layer and the first color are blue.

A display device according to a fifth aspect of the disclosure, according to any one of the second to fourth aspects, includes: a third pixel configured to emit light of a third color having a longer wavelength than the second color, in which the quantum dots are the same material for the first pixel, the second pixel, and the third pixel, and the third pixel includes, as an upper layer above the common electrode, a third color conversion layer configured to emit light of the third color through photoexcitation using light of the first color.

A display device according to a sixth aspect of the disclosure, according to the first aspect, includes: a first pixel configured to emit light of a first color; and a second pixel configured to emit light of a second color having a longer wavelength than the first color, in which the quantum dots include a first quantum dot configured to emit light of the first color and a second quantum dot configured to emit light of the second color, the ferritin is the same material for the first pixel and the second pixel, and the pixel electrodes are the same material for the first pixel and the second pixel.

A display device according to a seventh aspect of the disclosure, according to the sixth aspect, includes: a first carrier transport layer sandwiched between the light-emitting layer of the first pixel and the common electrode; and a second carrier transport layer sandwiched between the light-emitting layer of the second pixel and the common electrode, in which the first carrier transport layer exposes an upper portion of the pixel electrode of the second pixel, and covers an end of the pixel electrode of the second pixel, and the second carrier transport layer exposes an upper portion of the pixel electrode of the first pixel, and covers an end portion of the pixel electrode of the first pixel.

A display device according to an eighth aspect of the disclosure, according to the sixth or seventh aspect, includes: a third pixel configured to emit light of a third color having a longer wavelength than the second color, in which the quantum dots include the first quantum dot, the second quantum dot, and a third quantum dot configured to emit light of the third color, the ferritin is the same material for the first pixel, the second pixel, and the third pixel, and the pixel electrodes are the same material for the first pixel, the second pixel, and the third pixel.

In a display device according to a ninth aspect of the disclosure, according to any one of the first to eighth aspect, a material of the pixel electrodes is any material selected from gold, platinum, palladium, titanium, silver, and nickel.

A display device according to a tenth aspect of the disclosure includes: a plurality of pixel electrodes; a common electrode common to the plurality of pixel electrodes; and a carrier transport layer and a light-emitting layer sandwiched between the plurality of pixel electrodes and the common electrode, in which the light-emitting layer includes quantum dots covered by ferritin, and the carrier transport layer and the quantum dots are bonded via a peptide modifying the ferritin.

In a display device according to an eleventh aspect of the disclosure, according to the tenth aspect, a material of the carrier transport layer is zinc oxide.

A manufacturing method of a display device according to a twelfth aspect of the disclosure includes: creating a first pixel electrode; and creating a first light-emitting layer configured to emit light of a first color by applying a first quantum dot covered by ferritin on the first pixel electrode, in which the first pixel electrode and the first quantum dot are bonded via a peptide modifying the ferritin.

A manufacturing method of a display device according to a thirteenth aspect of the disclosure, according to the twelfth aspect, includes: creating a second pixel electrode; creating a second light-emitting layer configured to emit light of the first color by applying the first quantum dot on the second pixel electrode; and creating, as an upper layer above the second light-emitting layer, a second color conversion layer configured to emit light of a second color having a longer wavelength than the first color through photoexcitation using light of the first color.

A manufacturing method of a display device according to a fourteenth aspect of the disclosure, according to the thirteenth aspect, includes: creating a third pixel electrode; creating a third light-emitting layer configured to emit light of the first color by applying the first quantum dot on the third pixel electrode; and creating, as an upper layer above the third light-emitting layer, a third color conversion layer configured to emit light of a third color having a longer wavelength than the second color through photoexcitation using light of the first color.

A manufacturing method of a display device according to a fifteenth aspect of the disclosure, according to the twelfth aspect, includes: creating a second pixel electrode; and creating a second light-emitting layer configured to emit light of a second color having a longer wavelength than the first color by applying a second quantum dot covered by ferritin on the second pixel electrode, in which the second pixel electrode and the second quantum dot are bonded via a peptide modifying the ferritin.

A manufacturing method of a display device according to a sixteenth aspect of the disclosure, according to the fifteenth aspect, includes: creating a third pixel electrode; and creating a third light-emitting layer configured to emit light of a third color having a longer wavelength than the second color by applying a third quantum dot covered by ferritin on the third pixel electrode, in which the third pixel electrode and the third quantum dot are bonded via a peptide modifying the ferritin.

A manufacturing method of a display device according to a seventeenth aspect of the disclosure, according to the thirteenth or fifteenth aspect, includes: creating an edge cover between the first pixel electrode and the second pixel electrode before the first light-emitting layer and the second light-emitting layer are formed.

A manufacturing method of a display device according to an eighteenth aspect of the disclosure, according to the fourteenth or sixteenth aspect, includes: creating a first carrier transport layer on the first light-emitting layer after the first light-emitting layer is created on the first pixel electrode and before the second pixel electrode is created; creating a resist on the first light-emitting layer after the second light-emitting layer is created on the second pixel electrode; creating a second carrier transport layer on the resist and the second light-emitting layer; and removing the resist and the second carrier transport layer created on the resist.

In a manufacturing method of a display device according to a nineteenth aspect of the disclosure, according to the eighteenth aspect, the first carrier transport layer is created on the first pixel electrode and around the first pixel electrode.

In a manufacturing method of a display device according to a twentieth aspect of the disclosure, according to the eighteenth or nineteenth aspect, in the creating of the first carrier transport layer, a carrier transport layer formed of an inorganic material is created.

A manufacturing method of a display device according to a twenty-first aspect of the disclosure, according to any one of the twelfth to twentieth aspect, includes: after the first light-emitting layer is created, recovering the first quantum dot that is not bonded to the first pixel electrode using a cleaning fluid.

A manufacturing method of a display device according to a twenty-second aspect of the disclosure includes: creating a first pixel electrode; creating a first carrier transport layer on the first pixel electrode; and creating a first light-emitting layer configured to emit light of a first color by applying a first quantum dot covered by ferritin on the first carrier transport layer, in which the first carrier transport layer and the first quantum dot are bonded via a peptide modifying the ferritin.

In a manufacturing method of a display device according to a twenty-third aspect of the disclosure, according to the twenty-second aspect, a material of the first carrier transport layer is zinc oxide.

The disclosure is not limited to each of the embodiments described above, and various modifications may be implemented within a range not departing from the scope of the claims. Embodiments obtained by appropriately combining technical approaches stated in each of the different embodiments also fall within the scope of the technology of the disclosure. Novel technical features may also be formed by combining the technical approaches stated in each of the embodiments.

The invention claimed is:

1. A display device comprising:
a plurality of pixel electrodes;
a common electrode common to the plurality of pixel electrodes; and
a light-emitting layer sandwiched between the plurality of pixel electrodes and the common electrode,
wherein the light-emitting layer includes quantum dots covered by ferritin, and
each of the plurality of pixel electrodes and the quantum dots are bonded via a peptide modifying the ferritin.

2. The display device according to claim 1, comprising:
a first pixel configured to emit light of a first color; and
a second pixel configured to emit light of a second color having a longer wavelength than the first color,
wherein the quantum dots are the same material for the first pixel and the second pixel, and
the second pixel includes, as an upper layer above the common electrode, a second color conversion layer configured to emit light of the second color through photoexcitation using light of the first color.

3. The display device according to claim 2,
wherein the first color is blue, and
the first pixel includes, as an upper layer above the common electrode, a blue conversion layer configured to emit light of the blue through photoexcitation using light of the first color.

4. The display device according to claim 2,
wherein a color of light emitted by the light-emitting layer and the first color are blue.

5. The display device according to claim 2, comprising:
a third pixel configured to emit light of a third color having a longer wavelength than the second color,
wherein the quantum dots are the same material for the first pixel, the second pixel, and the third pixel, and
the third pixel includes, as an upper layer above the common electrode, a third color conversion layer configured to emit light of the third color through photoexcitation using light of the first color.

6. The display device according to claim 1, comprising:
a first pixel configured to emit light of a first color; and
a second pixel configured to emit light of a second color having a longer wavelength than the first color,
wherein the quantum dots include a first quantum dot configured to emit light of the first color and a second quantum dot configured to emit light of the second color,
the ferritin is the same material for the first pixel and the second pixel, and
the pixel electrodes are the same material for the first pixel and the second pixel.

7. The display device according to claim 6, comprising:
a first carrier transport layer sandwiched between the light-emitting layer of the first pixel and the common electrode; and
a second carrier transport layer sandwiched between the light-emitting layer of the second pixel and the common electrode,
wherein the first carrier transport layer exposes an upper portion of the pixel electrode of the second pixel, and covers an end of the pixel electrode of the second pixel, and
the second carrier transport layer exposes an upper portion of the pixel electrode of the first pixel, and covers an end of the pixel electrode of the first pixel.

8. The display device according to claim 6, comprising:
a third pixel configured to emit light of a third color having a wavelength longer than that of the second color,
wherein the quantum dots include the first quantum dot, the second quantum dot, and a third quantum dot configured to emit light of the third color,
the ferritin is the same material for the first pixel, the second pixel, and the third pixel, and
the pixel electrodes are the same material for the first pixel, the second pixel, and the third pixel.

9. The display device according to claim 1,
wherein the pixel electrodes are any material selected from gold, platinum, palladium, titanium, silver, and nickel.

10. A display device comprising:
a plurality of pixel electrodes;
a common electrode common to the plurality of pixel electrodes; and
a carrier transport layer and a light-emitting layer sandwiched between the plurality of pixel electrodes and the common electrode,
wherein the light-emitting layer includes quantum dots covered by ferritin, and
the carrier transport layer and the quantum dots are bonded via a peptide modifying the ferritin.

11. The display device according to claim 10,
wherein a material of the carrier transport layer is zinc oxide.

12. A manufacturing method of a display device, the method comprising:
creating a first pixel electrode; and
creating a first light-emitting layer configured to emit light of a first color by applying a first quantum dot covered by ferritin on the first pixel electrode,
wherein the first pixel electrode and the first quantum dot are bonded via a peptide modifying the ferritin.

13. The manufacturing method of a display device according to claim 12, comprising:
creating a second pixel electrode;
creating a second light-emitting layer configured to emit light of the first color by applying the first quantum dot on the second pixel electrode; and
creating, as an upper layer above the second light-emitting layer, a second color conversion layer configured to emit light of a second color having a longer wavelength than the first color through photoexcitation using light of the first color.

14. The manufacturing method of a display device according to claim 13, comprising:
- creating a third pixel electrode;
- creating a third light-emitting layer configured to emit light of the first color by applying the first quantum dot on the third pixel electrode; and
- creating, as an upper layer above the third light-emitting layer, a third color conversion layer configured to emit light of a third color having a longer wavelength than the second color through photoexcitation using light of the first color.

15. The manufacturing method of a display device according to claim 13, comprising:
- creating an edge cover between the first pixel electrode and the second pixel electrode before the first light-emitting layer and the second light-emitting layer are formed.

16. The manufacturing method of a display device according to claim 12, comprising:
- creating a second pixel electrode; and
- creating a second light-emitting layer configured to emit light of a second color having a longer wavelength than the first color by applying a second quantum dot covered by ferritin on the second pixel electrode,
- wherein the second pixel electrode and the second quantum dot are bonded via a peptide modifying the ferritin.

17. The manufacturing method of a display device according to claim 16, comprising:
- creating a third pixel electrode; and
- creating a third light-emitting layer configured to emit light of a third color having a longer wavelength than the second color by applying a third quantum dot covered by ferritin on the third pixel electrode,
- wherein the third pixel electrode and the third quantum dot are bonded via a peptide modifying the ferritin.

18. The manufacturing method of a display device according to claim 16, comprising:
- creating a first carrier transport layer on the first light-emitting layer after the first light-emitting layer is created on the first pixel electrode and before the second pixel electrode is created;
- creating a resist on the first light-emitting layer after the second light-emitting layer is created on the second pixel electrode;
- creating a second carrier transport layer on the resist and the second light-emitting layer; and
- removing the resist and the second carrier transport layer created on the resist.

19. The manufacturing method of a display device according to claim 18,
- wherein the first carrier transport layer is created on the first pixel electrode and around the first pixel electrode.

20. The manufacturing method of a display device according to claim 18,
- wherein, in the creating of the first carrier transport layer, a carrier transport layer formed of an inorganic material is created.

* * * * *